United States Patent [19]
Yoshida

[11] Patent Number: 5,799,138
[45] Date of Patent: Aug. 25, 1998

[54] APPARATUS FOR INSTRUCTION-WORD-LINK COMPRESSION

[75] Inventor: Yukihiro Yoshida, Ikoma, Japan

[73] Assignee: B.E. Technology Co., Ltd., Osaka, Japan

[21] Appl. No.: 655,758

[22] Filed: May 30, 1996

[30] Foreign Application Priority Data

Jun. 1, 1995 [JP] Japan .................................. 7-159853
Jan. 17, 1996 [JP] Japan .................................. 8-024551

[51] Int. Cl.⁶ .................................................. G06F 15/00
[52] U.S. Cl. .................................... 395/114; 395/386
[58] Field of Search ............................ 395/386, 114; 348/405; 358/426; 341/63

[56] References Cited

U.S. PATENT DOCUMENTS 4,760,461  7/1988  Sato ........................................ 341/63
4,819,079  4/1989  Takao ...................................... 358/426
4,839,797  6/1989  Katori et al. ........................... 395/386
5,216,518  6/1993  Yamagami ............................. 358/426
5,335,016  8/1994  Nakagawa ............................. 348/405
5,574,834  11/1996 Horie et al. ............................ 395/114

*Primary Examiner*—Tod R. Swann
*Assistant Examiner*—David Langjahr
*Attorney, Agent, or Firm*—Nakaido, Marmelstein, Murray & Oram LLP

[57] ABSTRACT

A digital data processing apparatus comprising a memory and a central processing unit. The digital data processing apparatus includes a code conversion section. The code conversion section assigns a virtual code for a duplicate code and converts the virtual code into a real code. The memory may consist of an external memory, and the external memory may include the code conversion section. The apparatus also comprises a code inverse section which converts an instruction to an address which is outputted to a memory through a data transmission path.

15 Claims, 27 Drawing Sheets

| 16 | 16 | 16 |
|---|---|---|
| 1 0 | 3 | 7 |
| 1 0 5 5 | 3 5 | 5 |
| 2 3 7 6 1 | | |
| | | 1 2 2 3 |
| 1 3 8 3 | 1 2 2 9 | 1 2 1 4 |

REAL ADDRESS (N/3)

| 16 | 16 | 16 |
|---|---|---|
| | 1 3 5 | 1 3 5 |
| 2 8 | 4 3 2 0 | 8 3 1 |
| 6 3 | 6 1 2 5 0 | |

| 16 | 16 | 16 | 16 |
|---|---|---|---|
| 1 0 | 3 | 7 | 1 0 5 5 |
| 3 5 | 5 | 2 3 7 6 1 | |

REAL ADDRESS (N/4)

| 16 | 16 | 16 | 16 |
|---|---|---|---|
| 1 2 2 3 | 1 3 8 3 | 1 2 2 9 | 1 2 1 4 |
| | 1 3 5 | 1 3 5 | 2 8 |
| 4 3 2 0 | 8 3 1 | 6 3 | 6 1 2 5 0 |

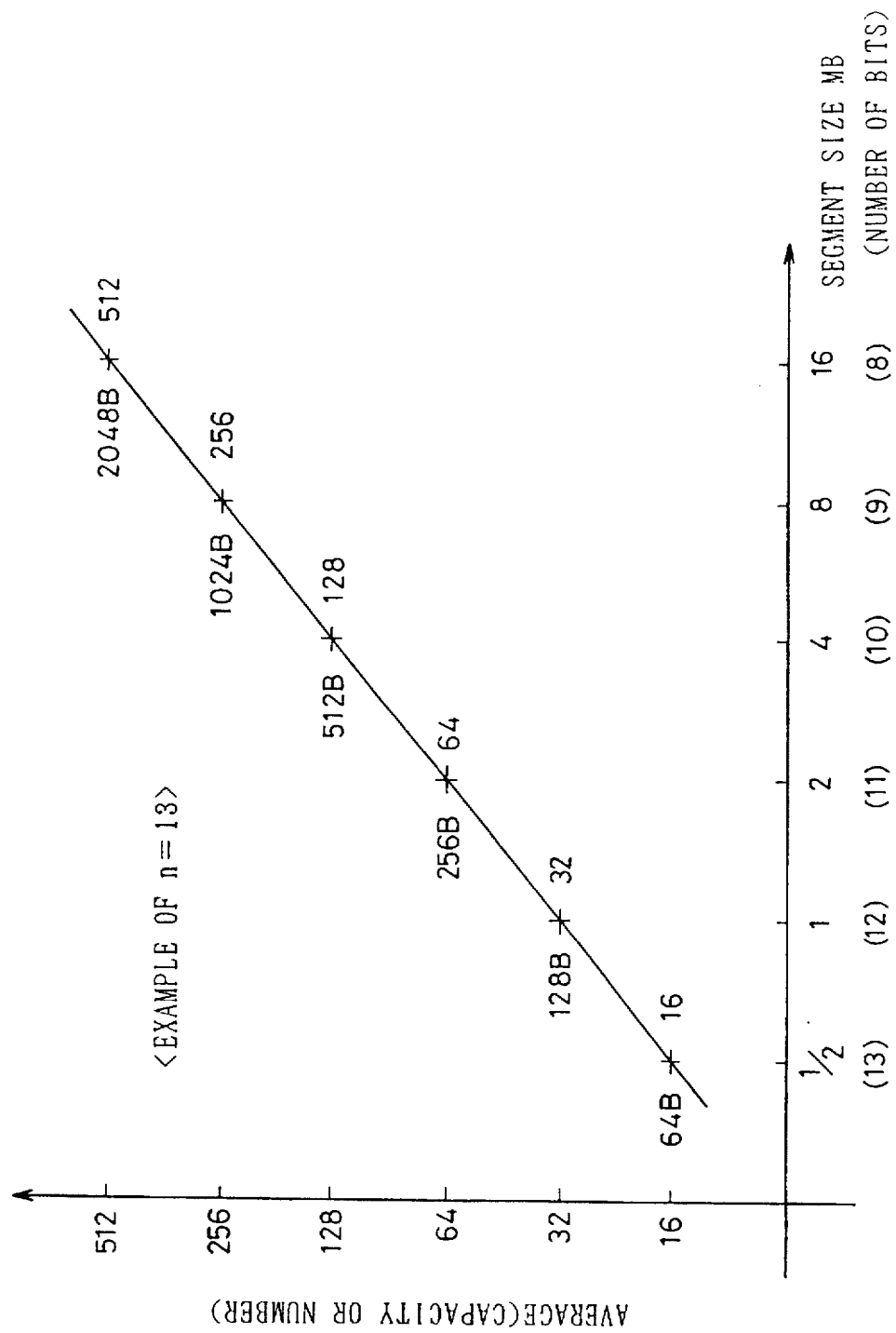

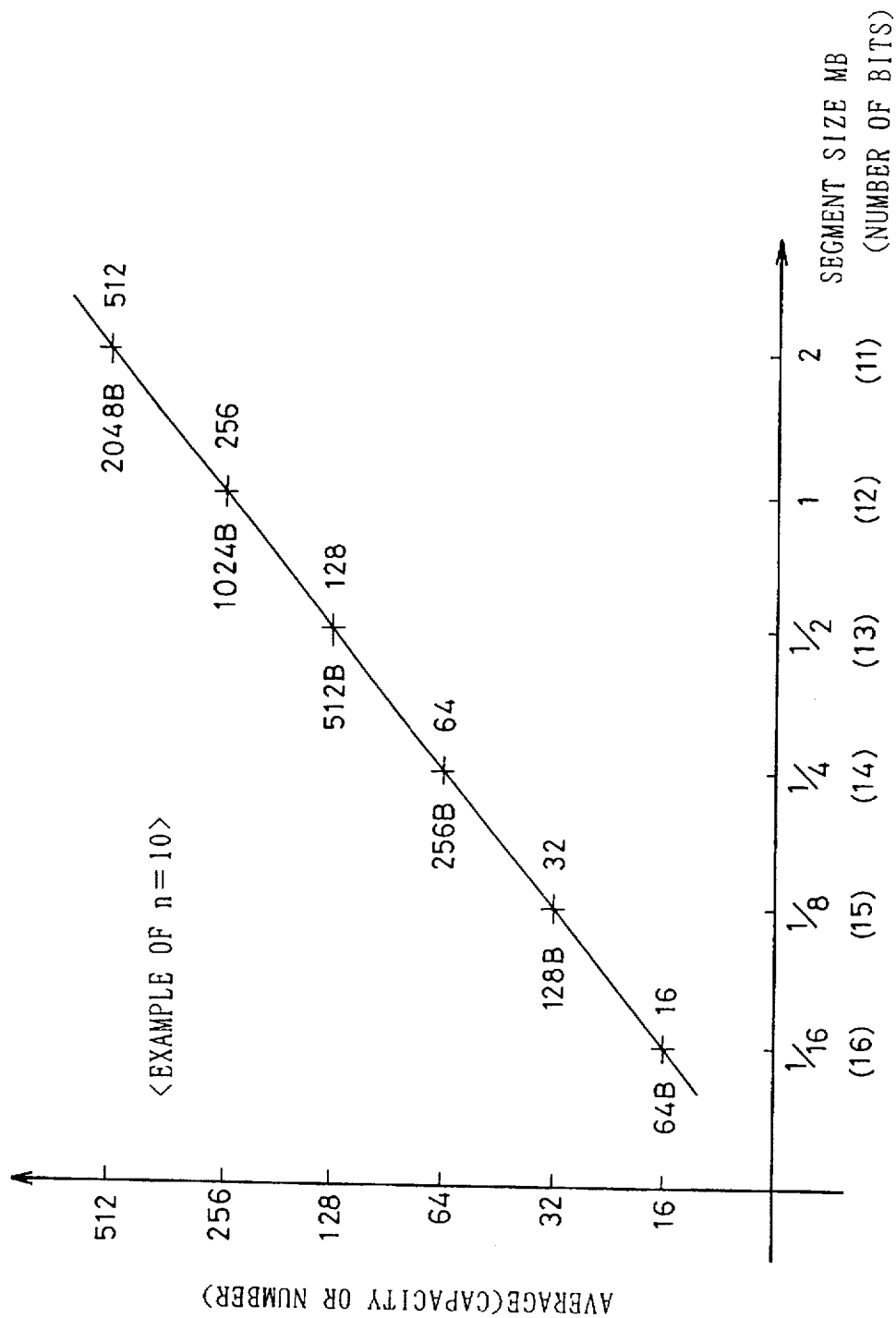

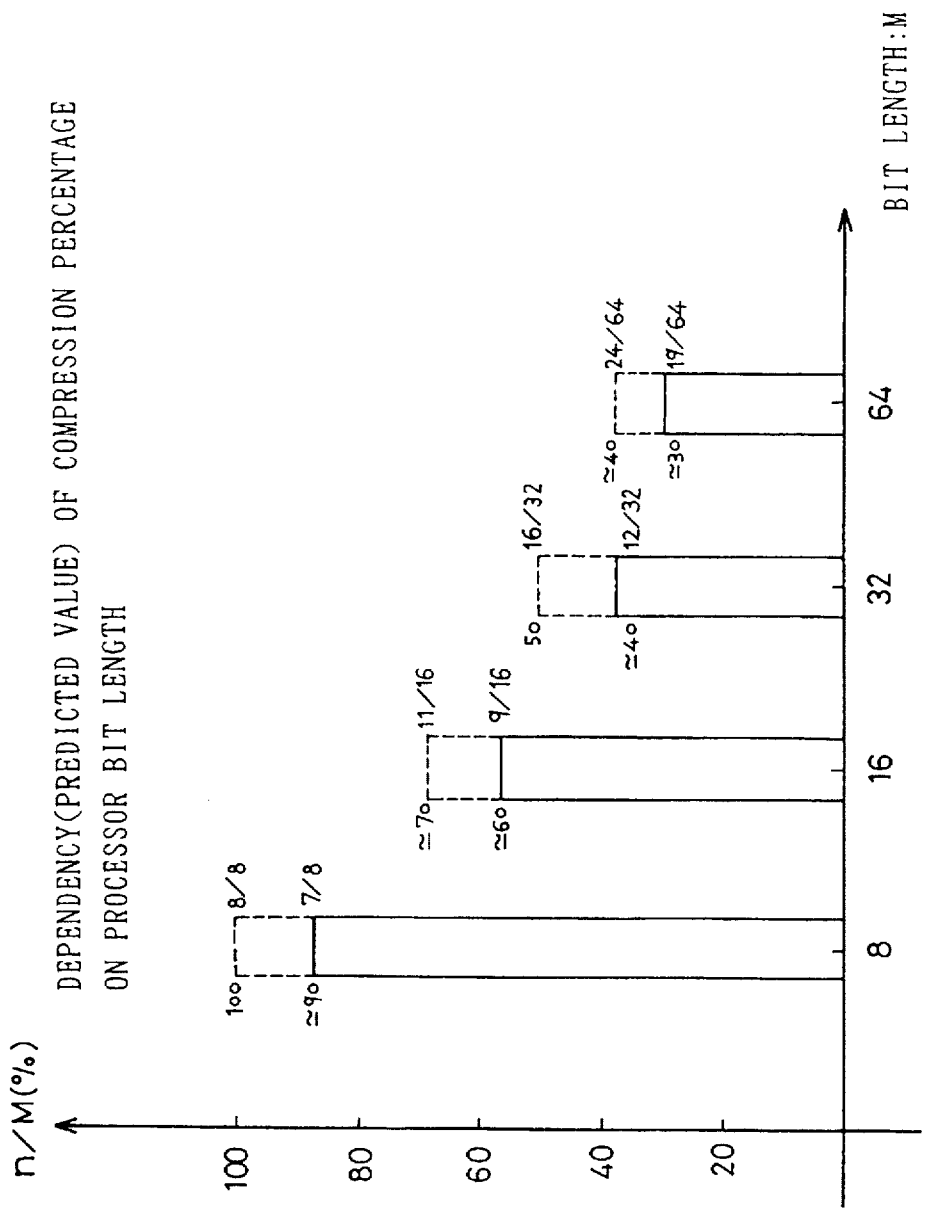

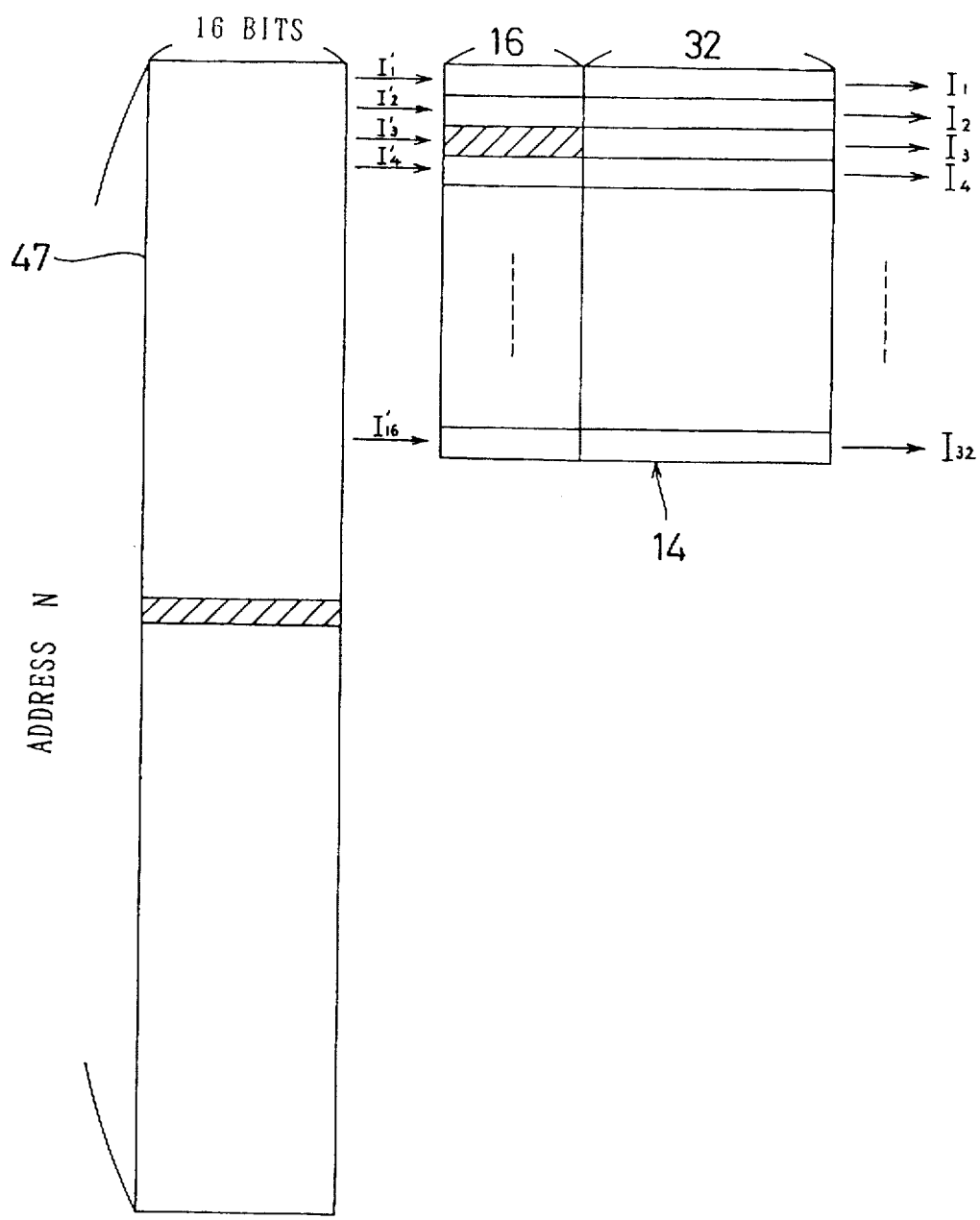

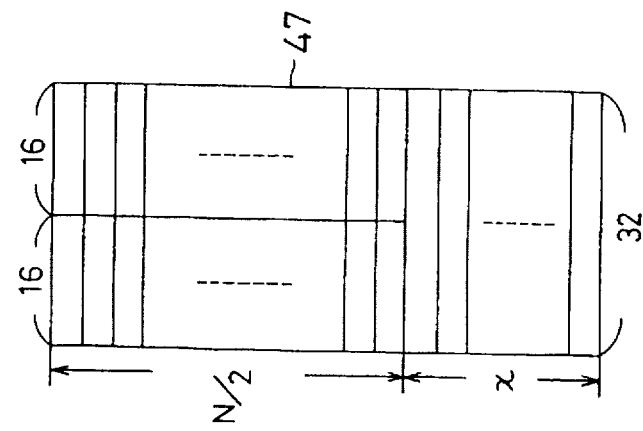
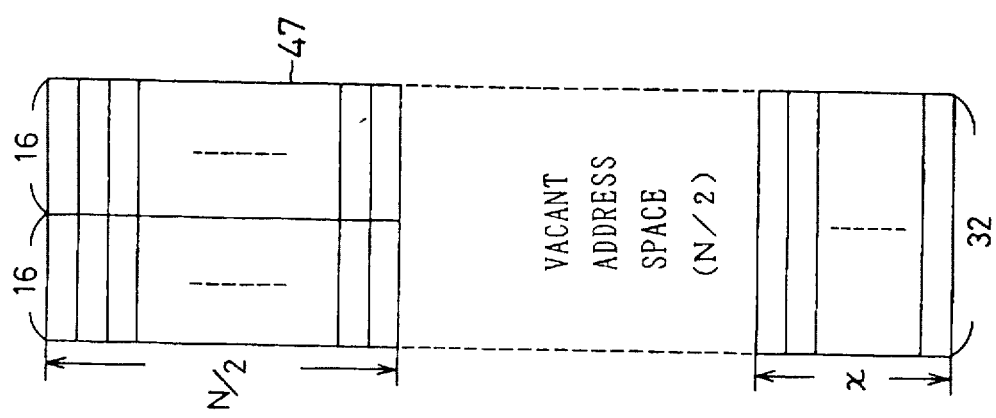
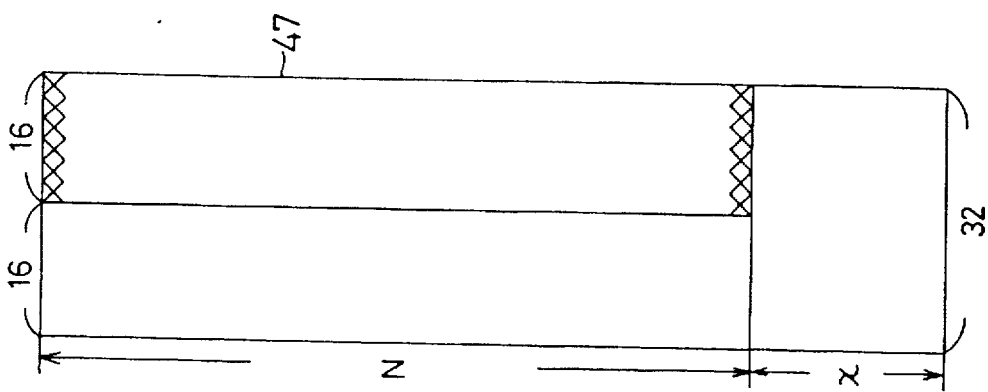

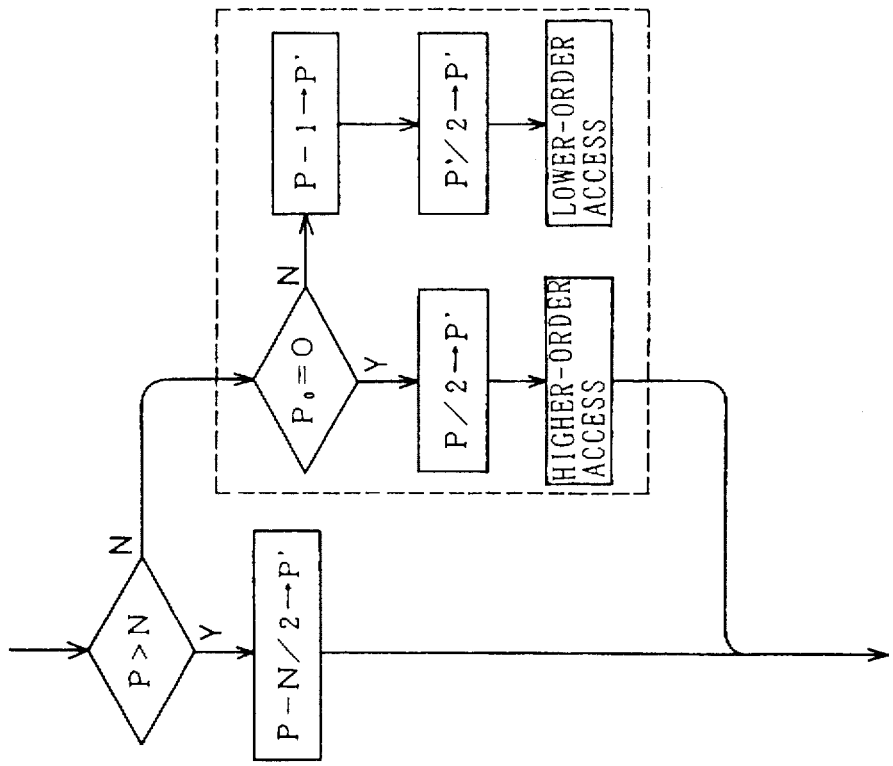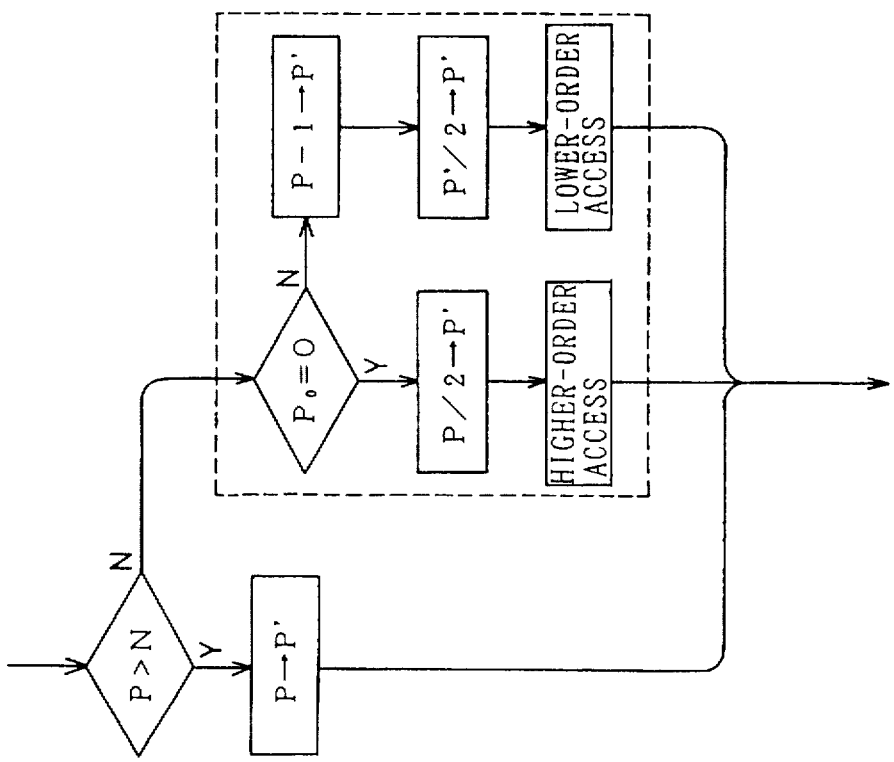

F I G. 29
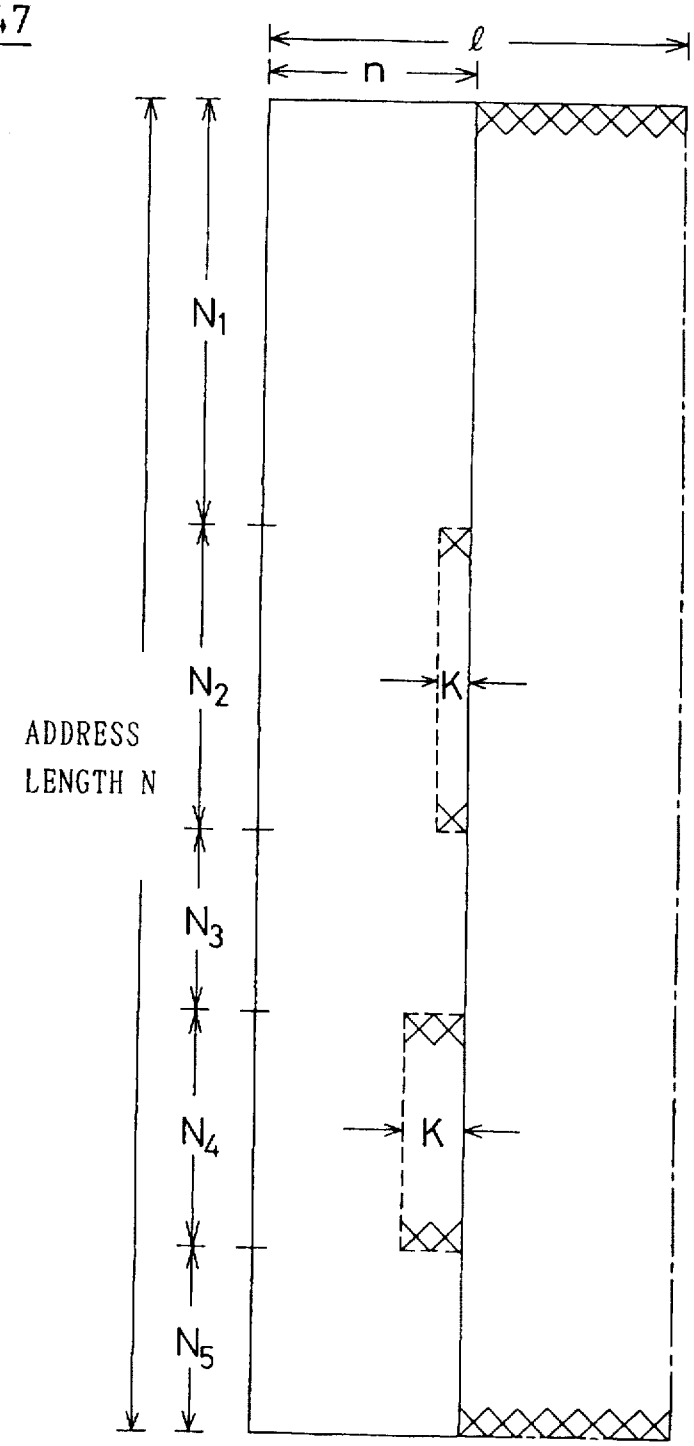

APPARATUS FOR INSTRUCTION-WORD-LINK COMPRESSION

BACKGROUND OF THE INVENTION

1. Field of the Invention

The present invention relates to a digital data processing apparatus, for example, a microprocessor, a personal computer, a word processor, a portable information terminal device, a digital signal processor and the like having a semiconductor memory.

2. Description of the Prior Art

In the conventional digital processing apparatus, various methods of compressing and decompressing digital data have been used. As a method of compressing and decompressing a moving image, DCT (discrete cosine transformation) has been used. MPEG (motion picture expert group) using "discrete cosine transformation" as a coding method and "motion-compensated interframe prediction" as a predictive coding method, is known. As the method of compressing and decompressing a still picture, JPEG (joint photographic expert group) using thinning of color data by means of "Huffman coding" and "discrete cosine transformation" is known. These compression/decompression methods are applied to image processing of non-coding method.

In facsimile transmission, a run length coding method is used as the compression/decompression method and is known as MR/MH/MMR method. Further, as the method of compressing and decompressing a text (numerical value, character), the Lempel Ziv method is known. This method is a loss-less (code compression having reversibility) method. Another compression/decompression method is the arithmetic coding (JBIG) method which is also a loss-less method.

The MPEG and the JPEG used as the compression/decompression methods of a moving image and a still picture, respectively are known as methods of "loss" (unreversible code compression), whereas in the digital data processing apparatus according to the present invention, the loss-less compression/decompression method is used.

In the compression/decompression method of the conventional digital data processing apparatus, even the loss-less method is not effective for the compression/decompression of a fixed length (for example, instruction code and data code are composed of 32 bits in a 32-bit processor) as in the case of an instruction code and a data code of a microprocessor. That is, in the conventional loss-less method, a compression effect is obtained as a variable length. Consequently, the period of time required for decompression is long and the size of a logic circuit is large. Further, it takes very long to execute decompression by means of software processing and, thus, a conventional loss-less method cannot be used practically. As described above, the compression/decompression of the conventional digital data processing apparatus is incapable of high-speed processing.

There is a growing demand for the development of a low power digital data processing apparatus. Not only in portable information terminal devices, but also in digital data processing apparatuses, the capacity of a memory for storing programs and data have increased greatly. microprocessors, for example, 32-bit microprocessors having a high performance have been increasingly developed. The compression/decompression of the conventional digital data processing apparatus cannot be, however, operated at low power and at high speed.

SUMMARY OF THE INVENTION

It is accordingly a main object of the present invention to provide a digital data processing apparatus capable of compressing and decompressing digital data at low electric power and at high speed.

In order to accomplish the object, there is provided a digital data processing apparatus comprising a memory and a central processing unit. The digital data processing apparatus includes a code conversion section for assigning a virtual code for a duplicate code and converting the virtual code into a real code.

The central processing unit may include the code conversion section. The memory may consist of an external memory, and the external memory may include the code conversion section. Preferably, the code conversion section consists of a reloadable ROM. The code conversion section may consist of a RAM. The central processing unit may consist of a microprocessor. The external memory may consist of a semiconductor memory.

A plurality of programs is stored in the memory, and the memory may include a program to which a primary compression and high-order compressions are applied by the code conversion section. A plurality of data is stored in the memory, and the memory may include data to which a primary compression and high-order compressions are applied by the code conversion section.

Because the space required to store data is greatly reduced by the present invention, the capacity of the external memory can be greatly reduced by assigning the virtual code for the duplicate code. Further, the compressed code can be instantaneously decompressed by converting the virtual code into the real code.

According to the present invention, the capacity of the external memory can be reduced greatly. Further, the compressed code can be decompressed instantaneously. Further, a memory slow in access can be used at a high speed and in addition, a low power memory can be constituted. Consequently, an inexpensive digital data processing apparatus can be manufactured. That is, the present invention provides a digital data processing apparatus capable of compressing and decompressing digital data at a low electric power and at a high speed.

Moreover, the present invention allows the digital data processing apparatus to be operated at a low electric power and is very effective for compressing and decompressing codes of microprocessors of high bits such as 96 bits, 128 bits, 256 bits, 512 bits, 640 bits, . . . and further, microprocessors of very high bits.

An LSI of a microprocessor adopting the VLIW (very long instruction word) method has many pins. The present invention allows the number of pins to be greatly reduced, thus being effective for a microprocessor using the VLIW method.

In a microprocessor which uses the VLIW method, a plurality of independent function units are used. Therefore, one instruction has a very long word length to perform a plurality of calculations. When the instruction is executed, other instructions are executed concurrently. In such a case, according to the present invention, the virtual code (compressed code) is loaded in advance and converted into the real code by the code conversion section. Thus, instructions can be concurrently executed in a novel manner.

The present invention can be applied to a compression/decompression method used in image processing. As the size of an image screen of a personal computer, a VGA (video graphic array) composed of 640×480 dots are usually adopted. In the screen control of the image processing, an image memory called a V-RAM (video memory) is used in both a CRT or an LCD (liquid crystal display). At this time, bit data of a screen is stored in the V-RAM. The image memory can be constituted by setting the constitution of 640×480 dots to 32×20×480 in the case of 32 bits and to 64×10×480 in the case of 64 bits. In this case, the memory constitution is 32×9600 or 64×4800 per screen. That is, a memory having a bit length (32 bits or 64 bits) and an address length (9600 or 4800) can be provided. According to the present invention, the necessary memory capacity of the V-RAM can be compressed and decompressed (reduced and increased). The present invention is particularly effective for compressing and decompressing the memory, of a fixed storing unit, such as a character font of image data, map data of a car navigation device utilizing a GPS (global positioning system) or dictionary data.

In a control by constituting the VGA (video graphic array) of a color screen, namely, a color image, a plurality of V-RAMs (video memories) is required. The present invention can be applied to one screen. Thus, even in a color image, the compression and decompression of the V-RAM can be accomplished.

A central processing unit will have a high performance, with the compatibility of the software maintained, by forming the code conversion section in the central processing unit. That is, the software stored in the memory is independent of the central processing unit. Therefore, the central processing unit will have a high performance, with the compatibility of the software maintained and without depending on accumulated resources of the software. Further, the code conversion section formed in the central processing unit provides security for the computer system.

The code conversion section formed in the external memory allows the memory itself to have a compression function. That is, the memory of the present invention is allowed to have a greatly reduced capacity, assuming that the digital data processing apparatus of the present invention and the conventional one have the same software function. That is, the digital data processing apparatus of the present invention is allowed to have a greatly increased software function, assuming that the memory of the present invention and the conventional one have the same capacity. That is, the provision of the code conversion section formed in the external memory provides "memory having a compression function" and security for the computer system.

The code conversion section composed of reloadable ROM can be rewritten as desired, thus providing security for the computer system. Further, the code conversion section composed of reloadable ROM allows instruction independent microprocessors and processor-independent softwares to be provided.

The above and further objects, features, aspects, and advantages of the present invention will be more fully apparent from the following detailed description with the accompanying drawings.

BRIEF DESCRIPTION OF THE DRAWINGS

FIG. 6 is a memory image view showing still another example of a case in which a virtual (pseudo) code is accommodated in an external memory.

FIG. 7 is a memory image view showing a further example of a case in which a virtual (pseudo) code is accommodated in an external memory.

FIG. 15 is a graph showing the relationship between a segment size and the average of the same instruction (or average capacity of the same object code), when n=13.

FIG. 16 is a graph showing the relationship between a segment size and the average of the same instruction (or average capacity of the same object code), when n=10.

FIG. 17 is a graph showing the compression percentage as a function of bit length of a processor.

FIG. 18 is a block diagram showing a semiconductor memory including a code conversion section.

FIG. 19 is a view showing an example of a memory image and describing a case in which the size of the code conversion section is fixed.

FIG. 20(A) is a flowchart showing an address management of an example shown in FIG. 19(B).

FIG. 20(B) is a flowchart showing an address management of an example shown in FIG. 19(C).

FIG. 29 is a view showing an example of a memory image obtained by compressing the capacity of an external memory to a bit width (n) in a primary compression and executing a secondary compression thereafter.

DETAILED DESCRIPTION OF THE PREFERRED EMBODIMENTS

A digital data processing apparatus, according to the present invention, which is applied to a 32-bit microprocessor will be described below with reference to the drawings.

Figure 1:
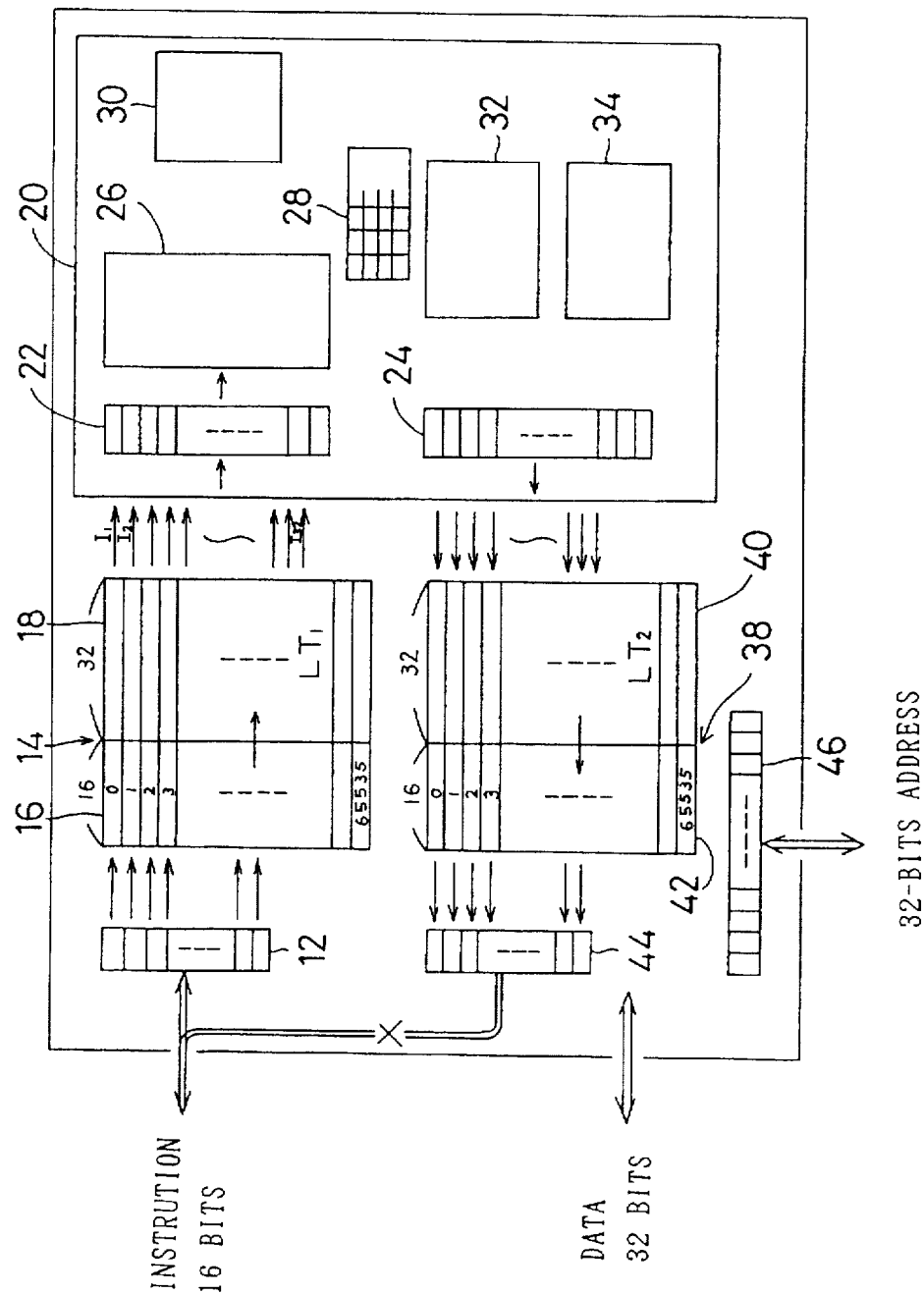
FIG. 1 is a block diagram showing a 32-bit microprocessor which executes a 16-bit access.

FIG. 1 is a block diagram showing a 32-bit microprocessor 10 which is applied to the execution of a 16-bit access. The 32-bit microprocessor 10 has a 16-bit register 12 which records a 16-bit instruction inputted from an external memory through a bus. The 16-bit register 12 is connected with a code conversion section 14. The code conversion section 14 includes a 16-bit address portion 16 and a 32-bit instruction portion 18. In the code conversion section 14, an object code being used is not duplicated with a code, for example, a duplicate object code (binary code), but a virtual (pseudo) code is assigned for each duplicate code so as to store the virtual code in the address portion 16 and the object code in the instruction portion 18. That is, an instruction, namely, the object code stored in the instruction portion 18 corresponds to an address, namely, the virtual code stored in the address portion 16 at the ratio of 1:1. The 16-bit register 12 is connected to the address portion 16 of the code conversion section 14. Thus, when the 16-bit register 12 accesses the code conversion section 14, the 16-bit register 12 accesses the address portion 16. That is, the external memory merely issues an address to the code conversion section 14 through the bus. An instruction, namely, a real code of the instruction portion 18 corresponding to the address of the address portion 16 accessed by the 16-bit register 12 is outputted to a CPU 20. That is, the code conversion section 14 has a function of converting the 16-bit address to the 32-bit instruction. The 16-bit address of the address portion 16 of the code conversion section 14 may be directly accessed through the bus not through the 16-bit register 12, but generally, the 16-bit register 12 is used for the external memory to execute an access to the code conversion section 14.

The CPU 20 includes 32-bit registers 22 and 24; an instruction decoder 26; a register group 28; a multiplier 30; a cache memory 32; and an MMU (Memory management unit) 34. The 32-bit instruction outputted from the instruction portion 18 is accessed by the 32-bit register 22; the 32-bit register 22 is accessed by the cache memory 32; and the 32-bit register 22 is accessed by the instruction decoder 26.

The 32-bit register 24 is connected with a code inverse conversion section 38. The code inverse conversion section 38 includes a 32-bit instruction portion 40 and a 16-bit address portion 42. An instruction, namely, an object code of the 32-bit instruction portion 40 and an address, namely, a virtual (pseudo) code of the 16-bit address portion 42 are recorded in the code inverse conversion section 38 at the ratio of 1:1. When the 32-bit register 24 accesses the code inverse conversion section 38, the 32-bit register 24 accesses the 32-bit instruction portion 40. An address of the 16-bit address portion 42 corresponding to an instruction of the 32-bit instruction portion 40 accessed by the 32-bit register 24 is accessed by a 16-bit register 44 and outputted to the bus. That is, the code inverse conversion section 38 has a function of converting the 32-bit instruction to the 16-bit address. Compressed data is outputted to the external memory through the bus.

The 32-bit microprocessor 10 includes a 32-bit address register 46 positioned outside the CPU 20. The 32-bit address register 46 outputs a 32-bit address to the bus and receives 32-bit address therefrom. The 32-bit microprocessor 10 outputs 32-bit data to the bus and receives 32-bit data therefrom.

Figure 2:
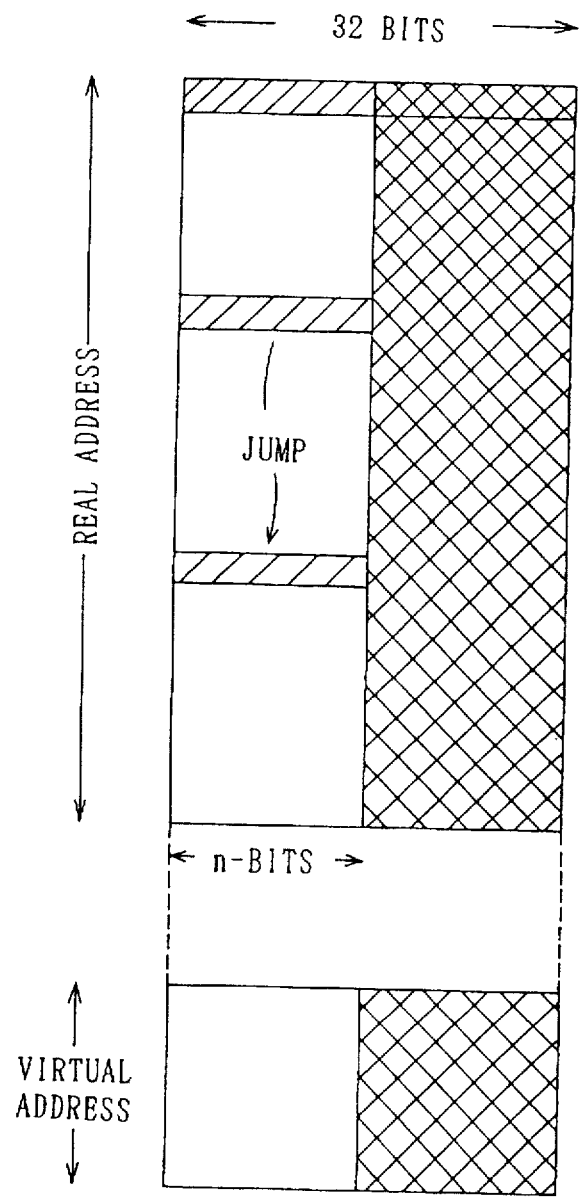
FIG. 2 is a concept view showing a state in which a memory area of an external memory is cut to compress a code.

Even in the system having a 32-bit processor, all 32-bit instruction codes and all 32-bit data codes are not used. That is, in a program, an object code being used is duplicated with a duplicate object code in a considerable amount. In order to solve this problem, in the present invention, an object code being used is not duplicated with a duplicate object code but a virtual (pseudo) code is assigned for each duplicate object code. The virtual (pseudo) code means a code virtually assigned for the object code being used to access the CPU 20 so as to prevent duplication of the objects code. According to the present invention, the length of the address of the virtual code is set to the same as that of a 32-bit instruction code. Because of this, as shown in FIG. 2, the memory area of an external memory 47 is cut and the code is compressed. As described above, in the code conversion section 14, after the virtual (pseudo) code is assigned for the duplicate object code, the virtual (pseudo) code is instantaneously decompressed to convert the virtual (pseudo) code into a real code. The real code means a code used to access the CPU 20.

Figure 3:
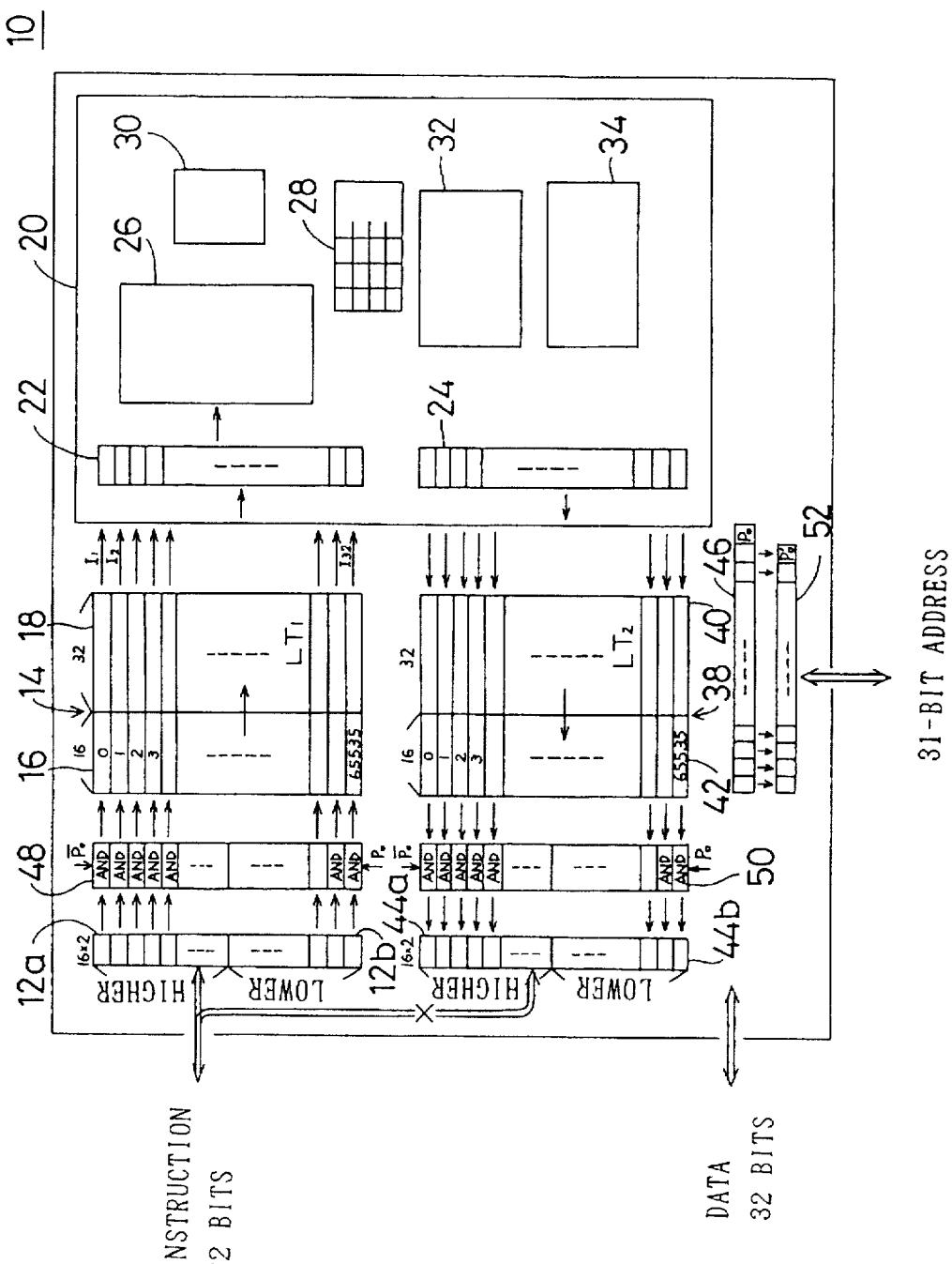
FIG. 3 is a block diagram showing a 32-bit microprocessor which executes a 32-bit access.

FIG. 3 is a block diagram showing a 32-bit microprocessor 10 which executes a 32-bit access. As will be described later, in this example, the address is managed according to whether an address (P) inside the processor is an even number or an odd number, namely, according to whether an address $P_0$ is "0" or "1".

The 32-bit microprocessor 10 has 16-bit registers 12a and 12b which record a 32-bit instruction inputted thereto through a bus. The 16-bit register 12a is used for higher-order access, while the 16-bit register 12b is used for lower-order access. The 16-bit registers 12a and 12b are connected with a code conversion section 14 through an index register 48 having an AND gate. When the 16-bit registers 12a and 12b access to the code conversion section 14 through the index register 48, the index register 48 determines whether the address (P) is an even number or an odd number. That is, the index register 48 determines whether the address $P_0$ is "0" to "1". If it is determined that the address (P) is an even number, the 16-bit register 12a for higher-order access executes an access to the code conversion section 14, whereas if it is determined that the address (P) is an odd number, the 16-bit register 12b for lower-order access executes an access to the code conversion section 14.

The code conversion section 14 includes a 16-bit address portion 16 and a 32-bit instruction portion 18. In the code conversion section 14, an object code being used is not duplicated with a code, for example, a duplicate object code (binary code), but a virtual (pseudo) code is assigned for each duplicate, code so as to store the virtual code in the address portion 16 and the object code in the instruction portion 18. That is, an instruction, namely, the object code stored in the instruction portion 18 corresponds to an address, namely, the virtual code stored in the address portion 16 at the ratio of 1:1. The 16-bit registers 12a and 12b are connected to the 16-bit address portion 16 of the code conversion section 14. Thus, when the 16-bit registers 12a and 12b access the code conversion section 14, the 16-bit registers 12a and 12b access the 16-bit address portion 16. An instruction, namely, a real code of the instruction portion 18 corresponding to an address of the address portion 16 accessed by the 16-bit registers 12a and 12b is outputted to the CPU 20. That is, the external memory merely issues an address to the code conversion section 14 through the bus. The instruction, namely, the real code of the instruction portion 18 corresponding to the address of the address portion 16 accessed by the 16-bit registers 12a and 12b is outputted to the CPU 20. That is, the code conversion section 14 has a function of converting the 16-bit address to the 32-bit instruction.

The CPU 20 includes 32-bit registers 22 and 24; an instruction decoder 26; a register group 28; a multiplier 30; a cache memory 32; and an MMU (Memory management unit) 34. The 32-bit instruction outputted from the instruction portion 18 is accessed by the 32-bit register 22; the 32-bit register 22 is accessed by the cache memory 32; and the 32-bit register 22 is accessed by the instruction decoder 26.

The 32-bit register 24 is connected with an inverse code conversion section 38. The code inverse conversion section 38 includes a 32-bit instruction portion 40 and a 16-bit address portion 42. When the 32-bit register 24 accesses the code inverse conversion section 38, the 32-bit register 24 accesses the 32-bit instruction portion 40. Thus, an address of the 16-bit address portion 42 corresponding to an instruction of the 32-bit instruction portion 40 accessed by the 32-bit register 24 is accessed by a 16-bit register 44a or a 16-bit register 44a through an index register 50 having an AND gate and is outputted to the bus. At this time, the index register 50 determines whether the address of the 16-bit address portion 42 has been accessed by the 16-bit register 44a for higher-order access or by the 16-bit register 44b for lower-order access. If it is determined that the address of the 16-bit address portion 42 has been accessed by the 16-bit register 44a for higher-order access, "0" is given to the address $P_o$, whereas it is determined that the address of the 16-bit address portion 42 has been accessed by the 16-bit register 44b for lower-order access, "1" is given to the address $P_0$.

The 32-bit microprocessor 10 includes a 32-bit address register 46 and a 31-bit address register 52 positioned outside the CPU 20. Excluding the address $P_0$, the 32-bit address register 46 accesses the 31-bit address register 52 at the 31-bit addresses thereof, whereas the 31-bit address register 52 accesses the 32-bit address register 46 at the 32-bit addresses obtained by adding the address $P_0$ to the 31-bit address. The 31-bit address register 52 outputs the 31-bit address to the external bus and receives the 31-bit address therefrom. The 32-bit microprocessor 10 outputs 32-bit data to the bus and receives the 32-bit data therefrom.

Figure 4:
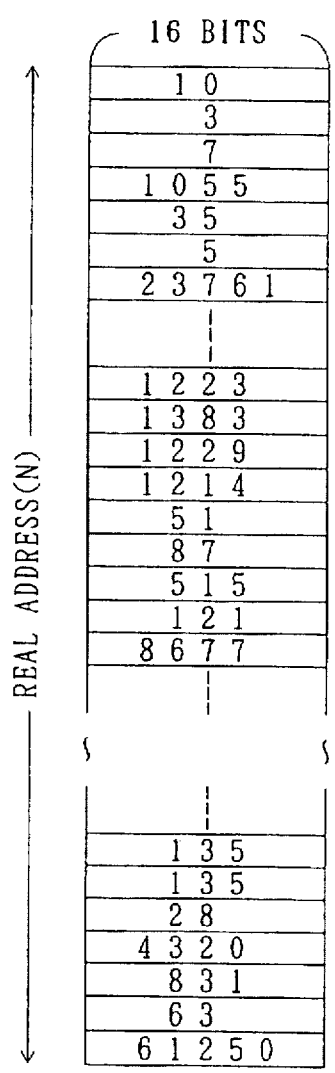
FIG. 4 is a memory image view showing an example of a case in which a virtual (pseudo) code is accommodated in an external memory.
Figure 5:
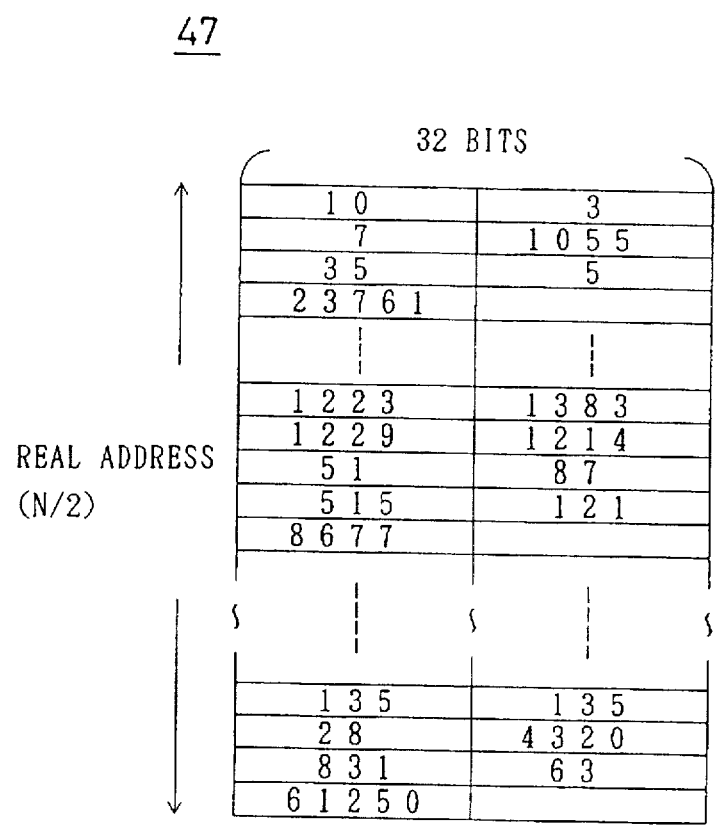
FIG. 5 is a memory image view showing another example of a case in which a virtual (pseudo) code is accommodated in an external memory.
Figure 8:
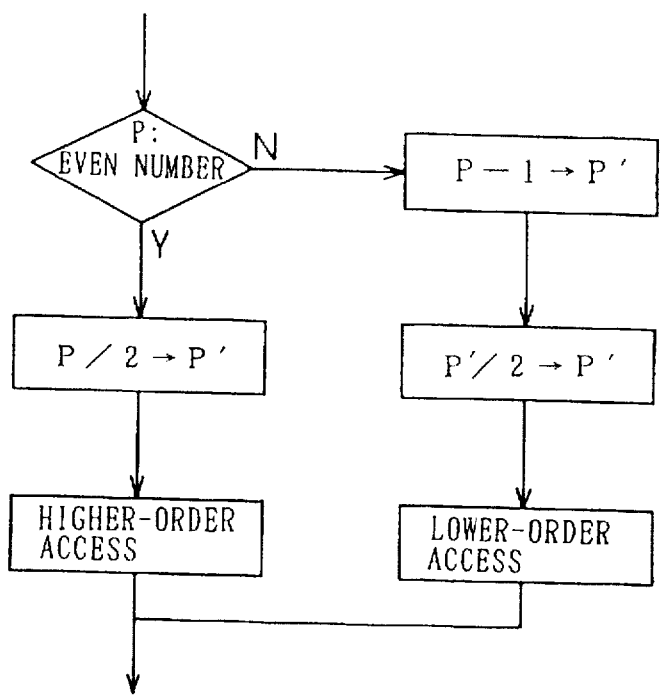
FIG. 8 is a flowchart showing an address management in the case of a 32-bit access with P an even number.
Figure 10:
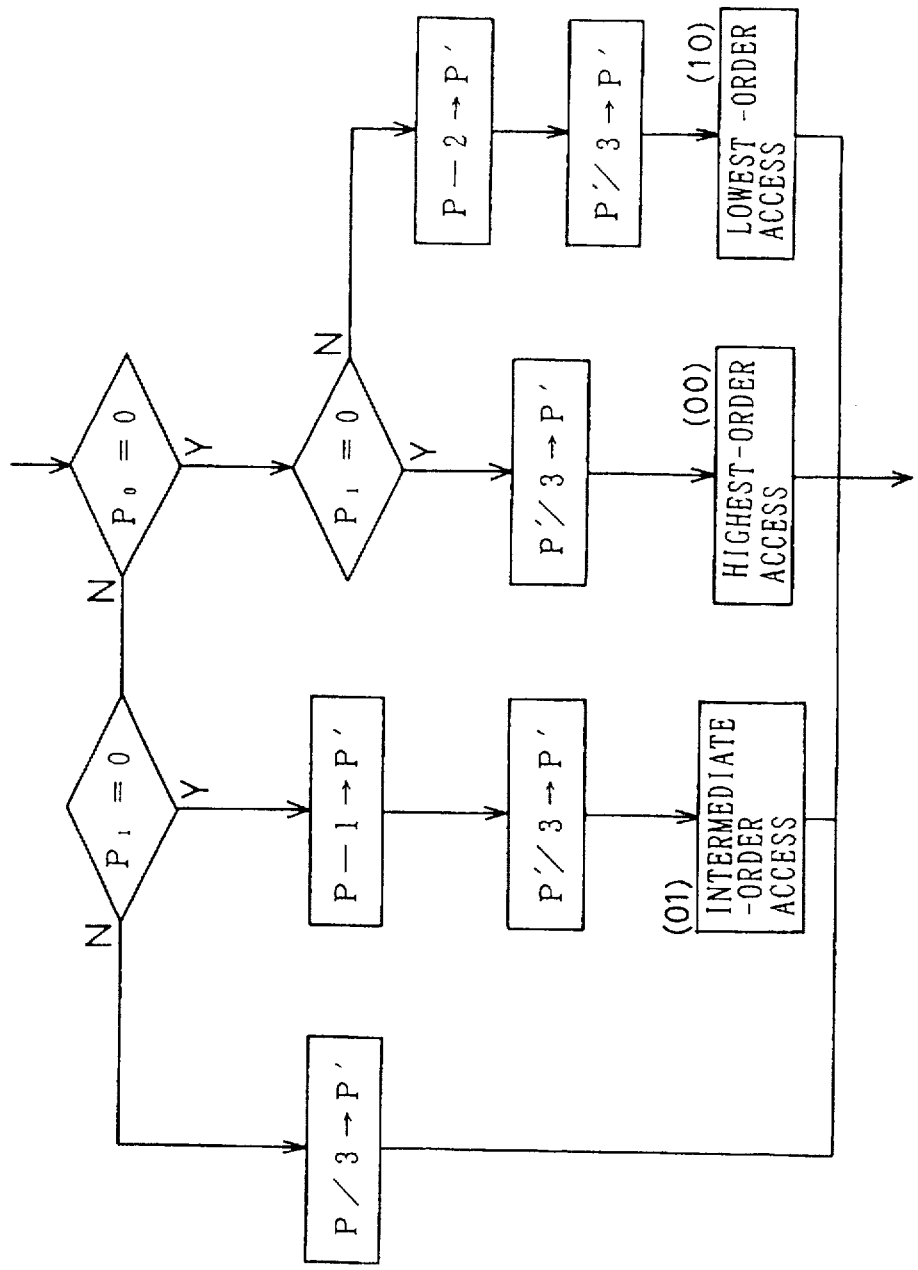
FIG. 10 is a flowchart showing an address management in the case of a 48-bit access.
Figure 11:
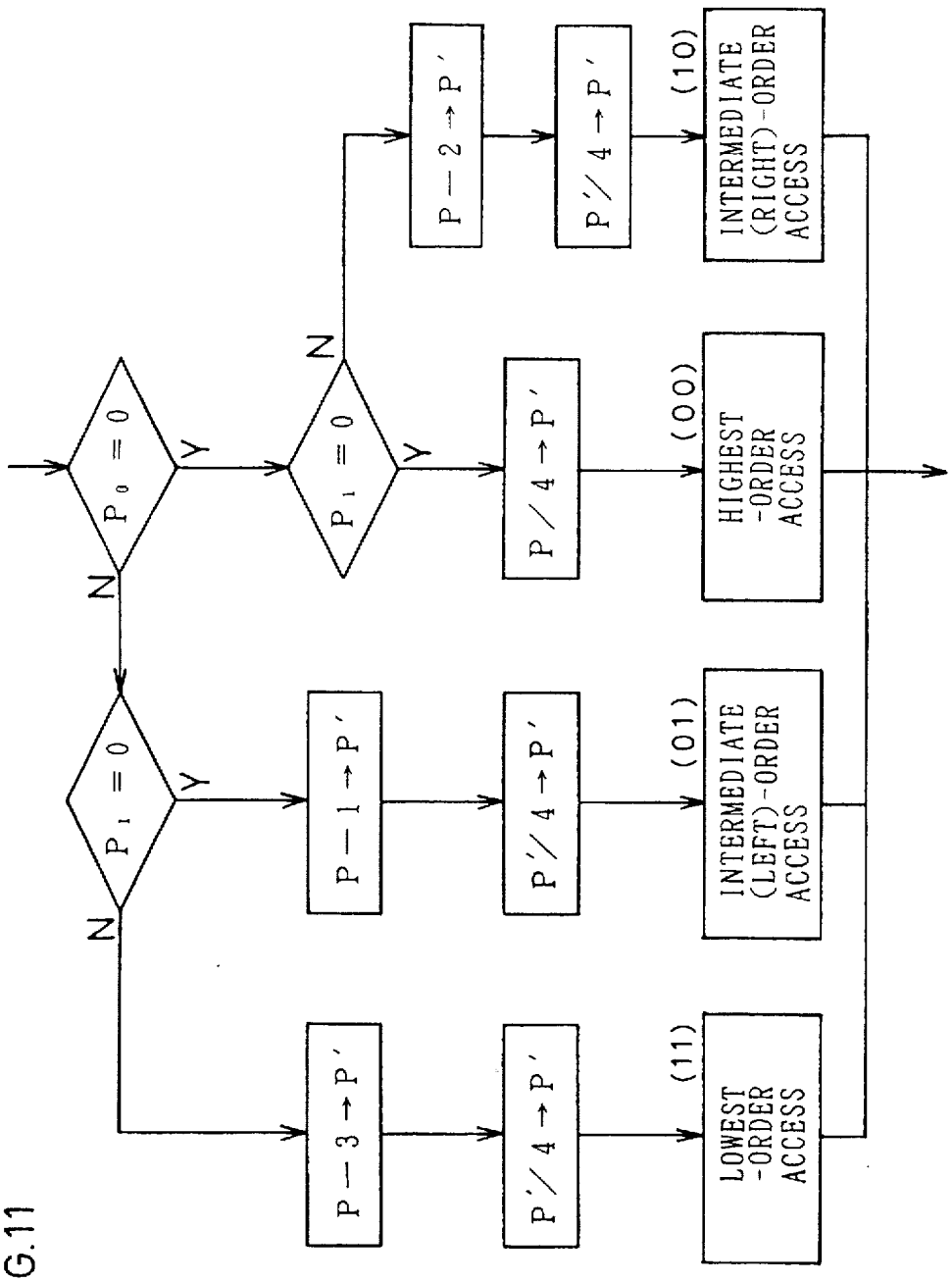
FIG. 11 is a flowchart showing an address management in the case of a 64-bit access.

With reference to FIGS. 4 through 7, the case in which a virtual code is stored in the external memory 47 will be exemplified below. Referring to FIGS. 4 through 7, a stored code is an address code of a table. FIG. 4 shows the case in which the 16-bit access shown in FIG. 1 is executed. In this case, the address management can be easily executed. In the case of the 16-bit access, the real address is N. FIG. 5 shows the case in which the 32-bit access shown in FIG. 3 is executed. In this case, a complex address management is executed. Whether the higher-order 16 bits are executed or the lower-order 16 bits are executed is managed according to whether the address (P) inside the processor is an even number or an odd number, namely, according to whether the address (P) inside the processor is "0" or "1". In the case of the 32-bit access, the real address is N/2. FIG. 6 shows the case in which a 48-bit access is executed. In this case, a complex address management is executed. As shown in FIG. 10, an address to be accessed is managed according to whether an address ($P_0$, $P_1$) inside the processor is (0, 0), (0, 1) or (1, 0). In the case of the 48-bit access, the real address is N/3. FIG. 7 shows the case in which a 64-bit access is executed. In this case, a complex address management is executed. As shown in FIG. 11, an address to be accessed is managed according to whether an address ($P_0$, $P_1$) inside the processor is (0, 0), (0, 1), (1, 0) or (1, 1). In the case of the 64-bit access, the real address is N/4. The reason such accesses can be accomplished is because data is compressed.

In the examples shown in FIGS. 1 and 3, the 32-bit microprocessor 10 includes the code conversion section 14 and the code inverse conversion section 38. If the external memory is composed of a ROM, the 32-bit microprocessor 10 does not include the code inverse conversion section 38, but includes only the code conversion section 14.

In order to implement the present invention, it is necessary to create software which generates storage data. A necessary first program is a high-speed sort program which retrieves codes being actually used in a program such that the first program only retrieves one of the codes of the same kind in case a plurality of codes of the same kind exists. The role of the first program is to output codes such that more than one code of the same kind is not included and to output the number of output codes. A necessary second program is a program which generates table data of the code conversion section provided inside a processor. The role of the second program is to allow respective codes to correspond to addresses sequentially in order from the top address of the table. A necessary third program is a program which stores virtual (pseudo) codes which are compressed data resulting from source data (32-bit instruction code) in predetermined real addresses. The role of the third program is to binary-search the table provided inside the processor from the top thereof to detect the location of a code located at a predetermined address and store the address code in the real address.

Figure 13:
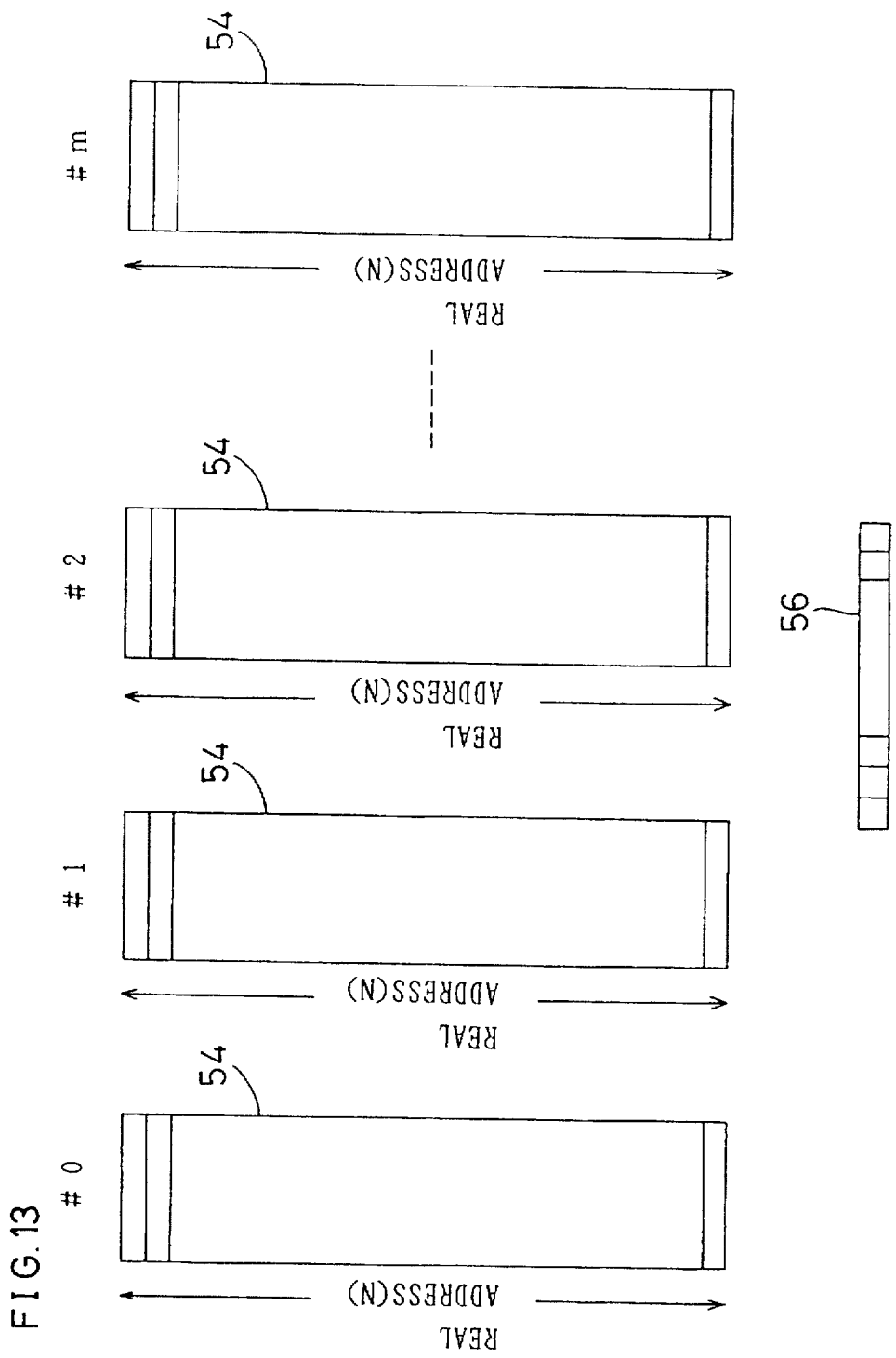
FIG. 13 is a block diagram showing a segment management of an add-on software.

FIG. 13 is a block diagram showing the segment management of add-on software. If the size of a program is large, it may be necessary to execute a segment management. For example, the program is divided into a segment 54 having (m+1) pieces. The segment 54 is controlled by a segment register 56 provided inside the microprocessor. The bit length of the segment register 56 is 8 or 9.

Figure 14:
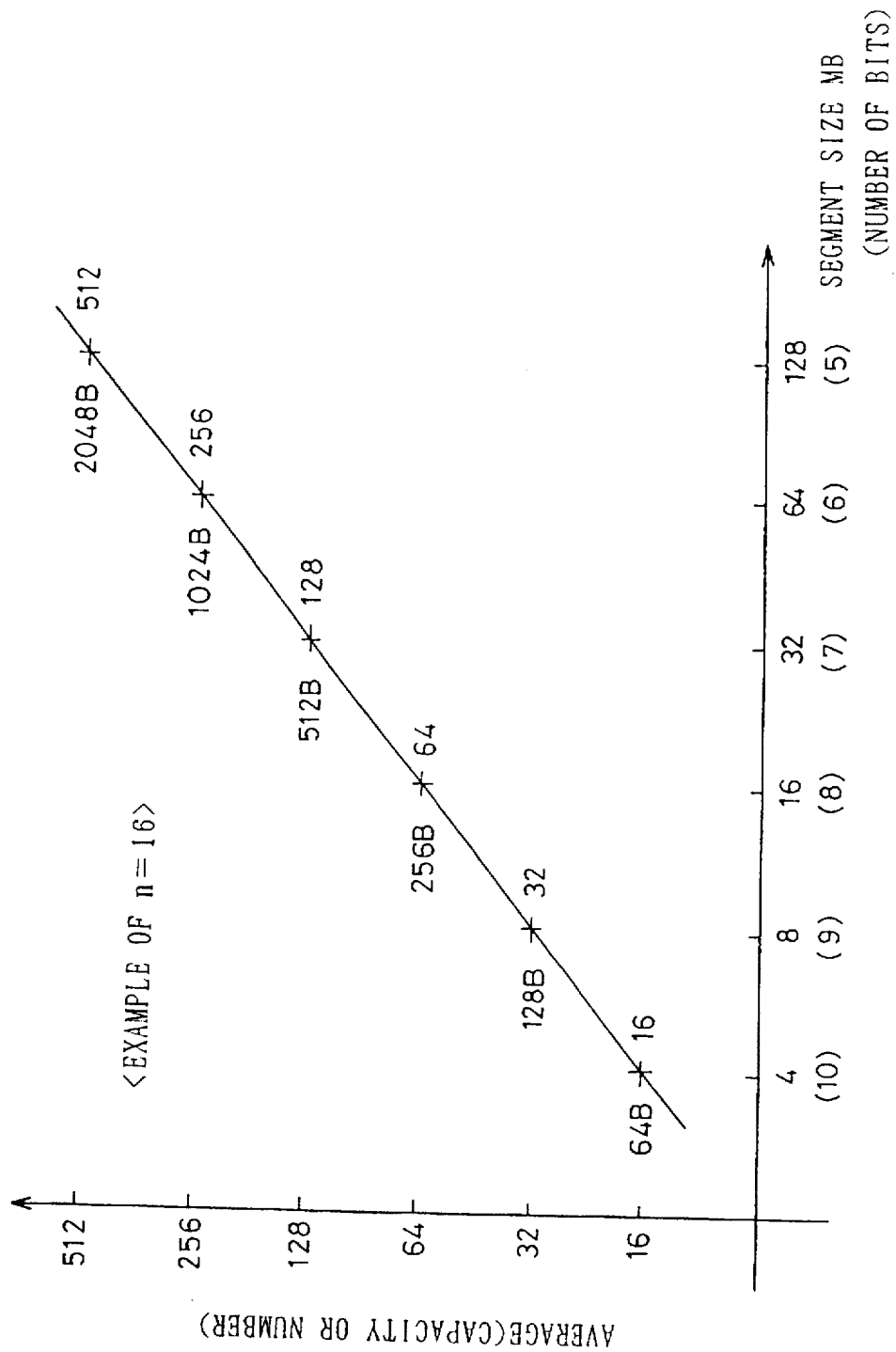
FIG. 14 is a graph showing the relationship between a segment size and the average of the same instruction (or average capacity of the same object code), when n=16.

Supposing that the number (x) of the kinds of object codes can be expressed by n bits, $x=2_n$ (n=logx/log2) and the compression percentage is n/32. FIG. 14 is a graph showing the relationship between the segment size of the segment 54 and the average of the same instruction (or average capacity of the same object code), when n=16. FIG. 15 is a graph showing the relationship between the segment size of the segment 54 and the average of the same instruction (or average capacity of the same object code), when n=13. FIG. 16 is a graph showing the relationship between the segment size of the segment 54 and the average of the same instruction (or average capacity of the same object code), when n=10. When the average of the same instruction is 32–64, the average capacity of the same object code is 128 B–256 B. When n=16, as shown in FIG. 14, the segment size of the segment 54 is 8 MB to 16 MB. When n=13, as shown in FIG. 15, the segment size of the segment 54 is 1 MB to 2 MB. When n=10, as shown in FIG. 16, the segment size of the segment 54 is ⅛ MB to ¼ MB. As is apparent from the above, the smaller the bit length (n) and the smaller compression percentage n/32, the smaller is the size of the segment 54.

Figure 12:
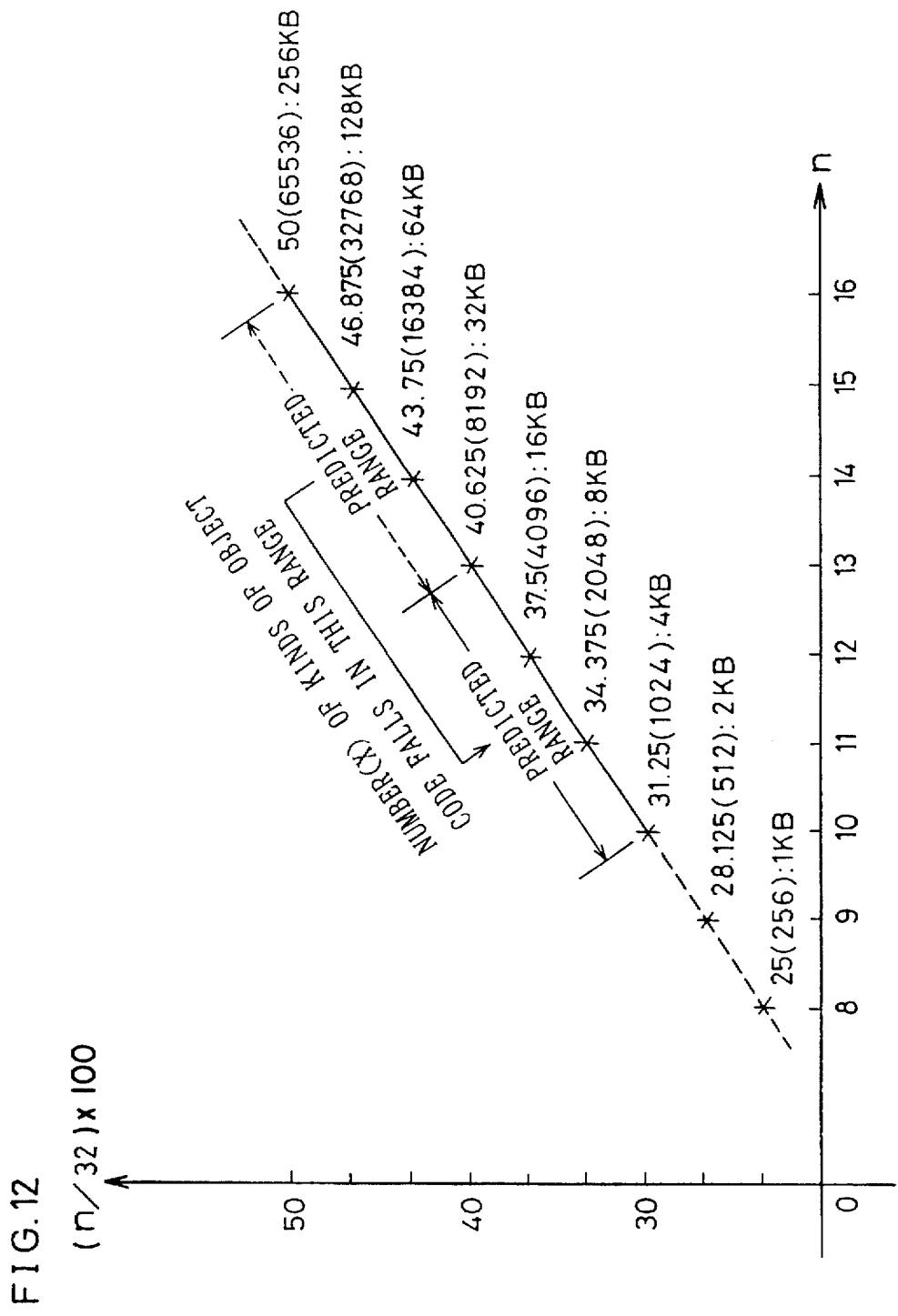
FIG. 12 is a graph showing the relationship between the number (n) of bits of the number of the kinds of object codes and a compression percentage n/32.

The compression percentage is different according to the number of kinds of object codes being used. Supposing that the number (x) of the kinds of object codes can be expressed in (n) bits, $x=2^n$ (n=logx/log2) and the compression percentage is n/32. FIG. 12 is a graph showing the relationship between the number (n) of bits of the number (x) of the kinds of object codes and the compression percentage n/32. Numerals of FIG. 12 sequentially indicate "compression percentage" ("length of code conversion section"): "necessary memory capacity". For example, if the number (x) of the kinds of object codes can be expressed in 16 bits, $x=2^{16}=65536$ and the compression percentage is ½. As a prediction, the number (x) of the kinds of object codes always falls in this range. If the number (x) of the kinds of object codes can be expressed in 20 bits, $x=2^{20}=1048576$ and the compression percentage is ⅝ (62.5%). There is no possibility that the number (x) of the kinds of object codes falls in this range. If the number (x) of the kinds of object codes can be expressed in 12 bits, $x=2^{12}=4096$ and the compression percentage is ⅜ (37.5%). There is a high possibility that the number (x) of the kinds of object codes falls in this range.

According to the present invention, the capacity of the external memory can be greatly reduced. As a result of 15 compression simulations of a 32-bit microprocessor, the following compression percentages have been obtained: 25.000%, 25.000%, 25.000%, 25.000%, 25.000%, 25.000%, 31.250%, 34.375%, 37.500%, 40.625%, 43.750%, 34.375%, 40.625%, 46.875%, 46.875%.

According to the present invention, the capacity of the external memory can be compressed at a high percentage of 30–40. Recently, 8-bit digital data processing apparatuses have been replaced with 16-bit digital data processing apparatuses, and the 16-bit digital data processing apparatuses are being replaced with 32-bit digital data processing apparatuses. It is supposed that a 32-bit digital data processing apparatus will be used mainly. In view of this tendency, the advantage obtained by compressing the capacity of the external memory greatly is particularly significant. Further, according to the present invention, a compressed code can be instantaneously decompressed. Moreover, the present invention allows a memory slow in access to be used at a high speed and allows a memory to be operated at a low electric power, thus providing low-cost digital data processing apparatuses. That is, the present invention provides digital data processing apparatuses capable of compressing and decompressing digital data at a low electric power and at a high speed.

The present invention is applicable to digital data processing apparatuses such as microprocessors, personal computers, word processors, portable information terminal devices, digital signal processors, and computers. Further, the present invention is applicable to various articles such as the Newton (registered trade mark), a personal digital assistant (PDA). Moreover, the present invention is applicable to 16-bit microprocessors and 16-bit microcomputers and in addition, to microprocessor and microcomputers incorporating a reloadable ROM. The code conversion section 14 composed of the reloadable ROM can be rewritten as desired, thus providing security for the computer system. The memory of the present invention is allowed to have a function (program) about twice as large as the conventional one, assuming that the memory of the present invention and the conventional one have the same capacity. That is, the memory of the present invention is allowed to have a capacity about ½ as small as that of the conventional memory, assuming that the memory of the present invention and the conventional one have the same function.

Further, the present invention provides instruction-independent microprocessors because they are allowed to have the same function which can be brought about by the code conversion section 14 composed of the reloadable ROM. Similarly, the present invention provides processor-independent softwares because they are allowed to have the same function which can be brought about by the code conversion section 14 composed of the reloadable ROM. Thus, the code conversion section 14 composed of the reloadable ROM can be used as software resources of other microprocessors. Furthermore, the use of the code conversion section 14 allows a CISC (complex instruction set computer) instruction to be converted into an RISC (reduced instruction set computer) instruction. That is, software written by the CISC instruction can be run by the RISC instruction.

As described previously, the present invention relates to a digital data processing apparatus. The digital data processing apparatus includes digital signal processors.

FIG. 17 is a graph showing the dependency (prediction value) of a compression percentage on a bit length of a digital signal processor. If the bit length (M) of the processor is 8, the compression percentage n/M is 7/8–8/8, namely, as large as 90%–100% which is a significant percentage. If the bit length of the processor is 16, the compression percentage n/M is 9/16–11/16, namely, about 60%–about 70%. If the bit length of the processor is 32, the compression percentage n/M is 12/32–16/32, namely, about 40%–about 50%. If the bit length of the processor is 64, the compression percentage n/M is 19/64–24/64, namely, about 30%–about 40%. As is apparent from the above, as the processor bit length (M) becomes larger, the compression percentage n/M becomes smaller.

In the examples shown in FIGS. 1 and 3, the code conversion section 14 is formed inside the 32-bit microprocessor 10, but the code conversion section 14 may be formed in the external memory 47. FIG. 18 is a block diagram showing a semiconductor memory including the code conversion section 14. When the code conversion section 14 is formed in the external memory 47, it is possible to compose the code conversion section 14 of a reloadable ROM by providing the code conversion section 14 with a flash memory and an FRAM (ferroelectric substance RAM). The memory including the reloadable code conversion section 14 provides computer security.

In each of the above-described examples, the real code (program and data) stored in the external memory 47 is compressed to the virtual code and then converted into the real code by the code conversion section 14. That is, in each of the examples, the real code is restored without fixing the size of the code conversion section 14 to a certain one, and thus the code conversion section 14 has complete realizability and flexibility. Usually, methods of not fixing the size of the code conversion section 14 to a certain one are practically adopted.

The present invention may be applied to a case in which the size of the code conversion section 14 is fixed. The case in which the size of the code conversion section 14 is fixed is described below. The fixing of the code conversion section 14 to a certain size is effective for an uncompressible code which cannot be converted into a real code. For example, this method is effective for a case in which the addition of a program or data inconvertible into the real code is executed in the code conversion section 14, the size of which is fixed.

FIG. 19 is a view showing an example of a memory image and describing a case in which the size of the code conversion section 14 is fixed. In an example shown in FIG. 19(A), in a portion having an address length (N), the bit length of a code is 16 and thus the compression percentage is ½. In a portion having an address length (x), the bit length of a code is 32, which is not compressed. Because processing cannot be executed in the state shown in FIG. 19(A), the address length is set to N/2 as shown in FIGS. 19(B) and 19(C), and 16-bit virtual codes are arranged side by side to constitute a 32-bit (16×2) external memory 47, similar to the example shown in FIG. 5. In this case, a vacant address space having the address length N/2 is generated, whereas in the example shown in FIG. 19(B), the portion having the vacant address space (x) is not changed. In the example shown in FIG. 19(C), the vacant address space having the address length N/2 is eliminated to provide a consecutive address having an address length (N/2+x).

Figure 9:
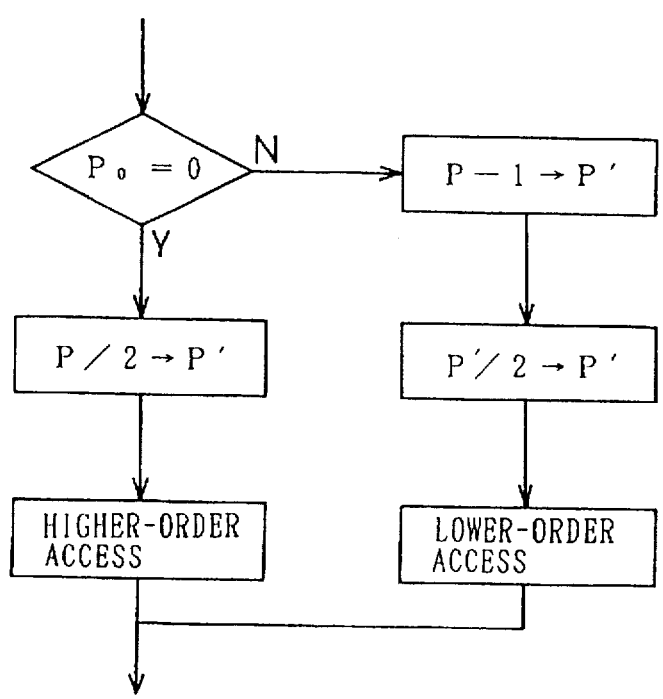
FIG. 9 is a flowchart showing an address management in the case of a 32-bit access with Po=0.

FIG. 20(A) is a flowchart showing the address management of the example shown in FIG. 19(B). FIG. 20(B) is a flowchart showing the address management of the example shown in FIG. 19(C). The portions of the flowchart of FIGS. 20(A) and 20(B) surrounded with a one-dot chain line are the same as that shown in FIG. 9. Unlike the flowchart shown in FIG. 9, in the flowchart shown in FIG. 20(A), a determination portion of "P>N" and a portion of "P→P'" are additionally provided. Unlike the flowchart shown in FIG. 9, in the flowchart shown in FIG. 20(B), the determination portion of "P>N" and a portion of "P−N/2→P'" are additionally provided.

The 32-bit microprocessor 10 shown in FIG. 1 has the 16-bit register 12 at the input portion to which an instruction (virtual code) is transmitted from the external memory 47. The 32-bit microprocessor 10 shown in FIG. 3 has the 16-bit registers 12a and 12b at the input portion to which an instruction (virtual code) is transmitted from the external memory 47. That is, the 32-bit microprocessor 10 shown in FIGS. 1 and 3 requires the register to execute a register control. But it is possible to execute a pipe line control so as to enhance parallel processing performance in executing instructions and accomplish high-speed processing. The pipe line control means a method of overlapping executions of mechanical instructions with each other, thus enhancing parallel processing performance in executing instructions and accomplishing a high-speed processing. Thus, the pipe line control is used in microprocessors having a high performance.

In the pipe line control, instructions (virtual code) transmitted from the external memory 47 are composed of 16 bits in the example shown in FIG. 1. Therefore, instructions flow sequentially through the pipe line. On the other hand, in the example shown in FIG. 3, instructions (virtual code) are composed of 32 bits. Therefore, two 16-bit instructions are inputted. At this time, in a fetch operation executed outside, the two 16-bit instructions are read. At this time, one of the two 16-bit instructions flows through the pipe line, whereas the other is written to a 16-bit latch which is a 16-bit pre-fetch buffer. In a subsequent fetch operation, the written 16-bit instruction can be instantly executed. That is, when the two 16-bit instructions are inputted, the external memory 47 is accessed only once for, every two instructions. Thus, high-speed processing can be accomplished. In the example described above, the portion of the register control shown in FIGS. 1 and 3 comprises a means of the pipe line control.

In the above example, the ROM or the reloadable ROM is used as the code conversion section 14. But instead of the ROM, it is possible to use a hard wired logic composed of an AND/OR circuit. A RAM used as the code conversion section 14 will be exemplified below.

Figure 21:
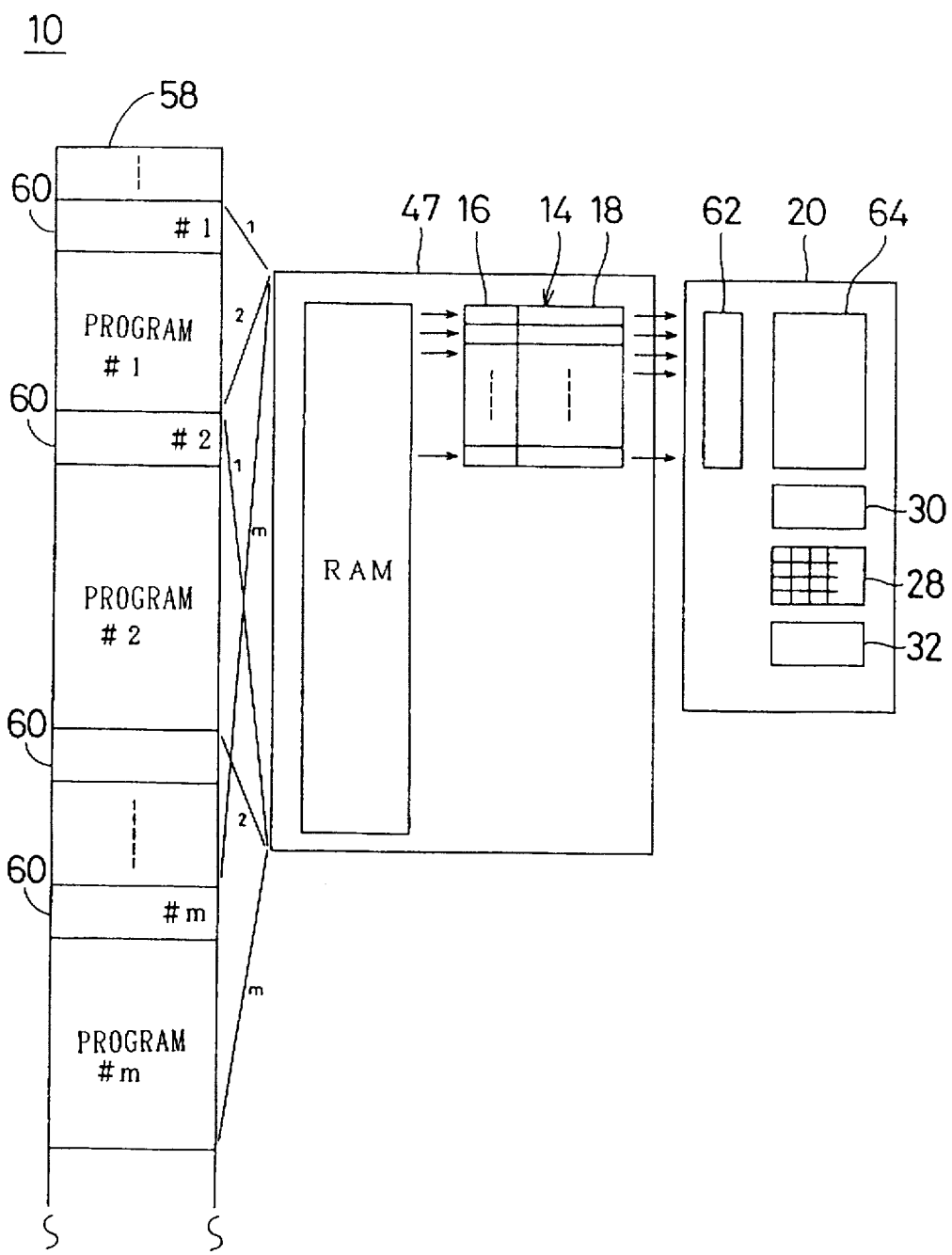
FIG. 21 is a block diagram showing another example of the present invention.
Figure 22:
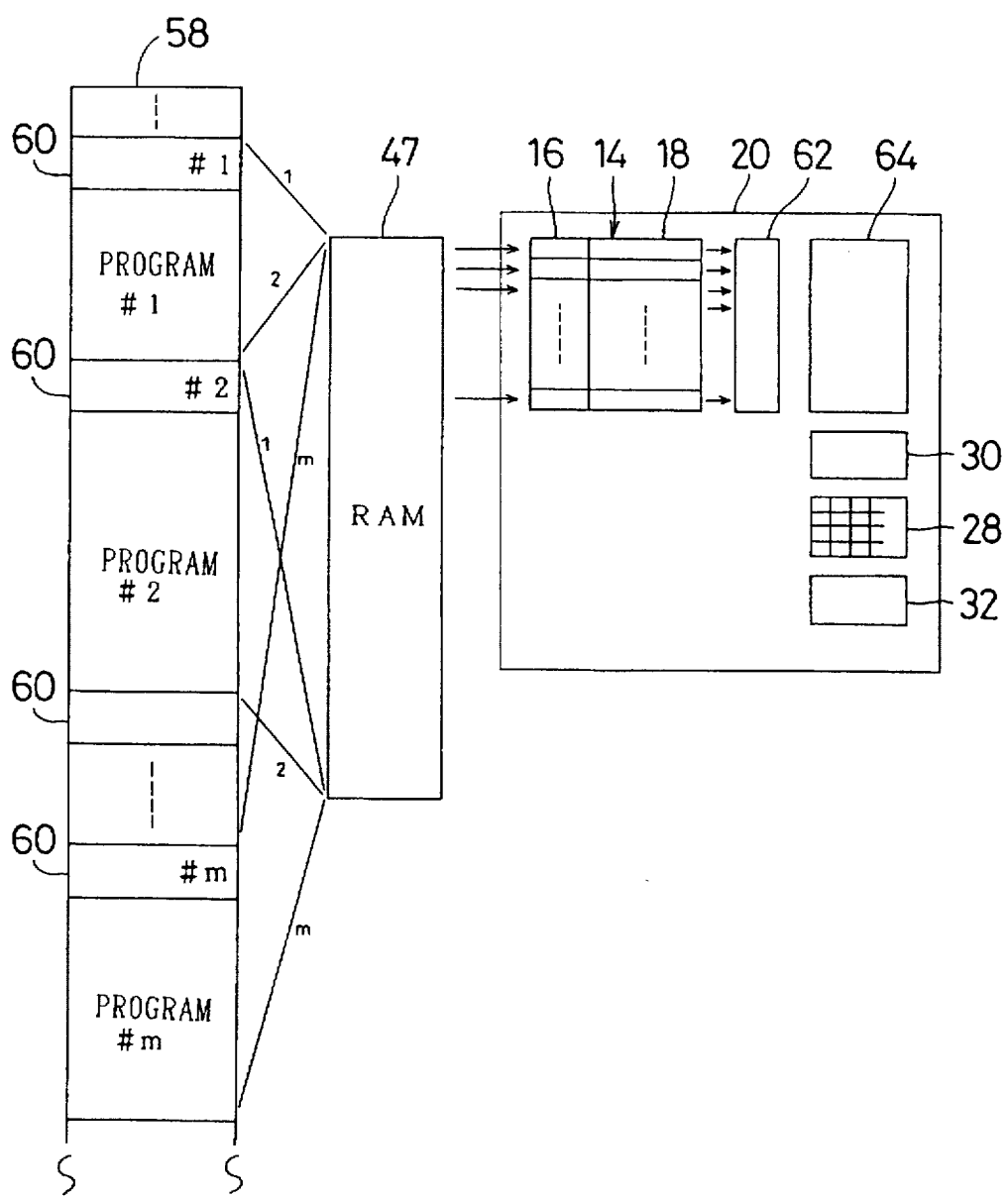
FIG. 22 is a block diagram showing a modification of the example shown in FIG. 21.

FIG. 21 is a block diagram showing another example of the present invention. FIG. 22 is a block diagram showing a modification of the example shown in FIG. 21. In the example shown in FIG. 21, the 32-bit microprocessor 10 includes an external storing unit 58, the external memory 47, and the CPU 20. The external storing unit 58 which is called a secondary storing unit stores a plurality of virtually-coded programs, similar to a hard disk system or a floppy disk system. The external storing unit 58 stores programs #1, #2, . . . , #m and code conversion sections 60 each corresponding to each of the programs #1, #2, . . . , #m. In this example, the code conversion section 14 is formed in the external memory 47 and composed of a RAM. The CPU 20 comprises a pipe line 62, an instruction decoder 64, a register group 28, a multiplier 30, and a cache memory 32.

As the external storing unit 58, in addition to the hard disk system or the floppy disk system, a semiconductor memory called a memory disk, a fixed storing unit M-ROM (mask ROM), a reloadable flash memory or a ferroelectric memory is used.

In the hard disk system or the floppy disk system, input and output of programs (job) or data is executed between a secondary storing unit and an external memory called a main storing unit. In the input and output of programs (job) or data, a control means called swapping (swap-in, swap-out), previously known in the art, is frequently used. "Swapping" means transferring jobs between the main storing unit and the secondary storing unit. To write out a job present in the main storing unit to the secondary storing unit is called swap-out, whereas to read a job present in the secondary storing unit into the main storing unit is called swap-in.

In the example shown in FIG. 21, programs #1, #2, . . . , #m stored in the external storing unit 58 are individually swapped in the external memory 47 consisting of a RAM, and also the code conversion sections 60 corresponding to each program is swapped in the code conversion section 14 provided inside the external memory 47. After the swap-in terminates, each program is executed between the external memory 47 and the CPU 20 by means of the above-described method. If information to be stored in the external storing unit 58 is data, a virtual code is swapped out from the code conversion section 14 of the external memory 47 to the external storing unit 58.

In the example shown in FIG. 21, the code conversion section 14 is formed in the external memory 47, whereas in an example shown in FIG. 22, the code conversion section 14 consisting of a RAM is formed in the CPU 20. In the example shown in FIG. 22, programs #1, #2, . . . , #m stored in the external storing unit 58 are individually swapped in the external memory 47 consisting of a RAM, and also the code conversion sections 60 each corresponding to each of the programs is swapped in the code conversion section 14 provided inside the CPU 20. After the swap-in terminates, each program is executed by means of the above-described method. The examples shown in FIGS. 21 and 22 are also capable of accomplishing an execution by means of down load to be executed between the external storing unit 58 and the external memory 47.

Figure 23:
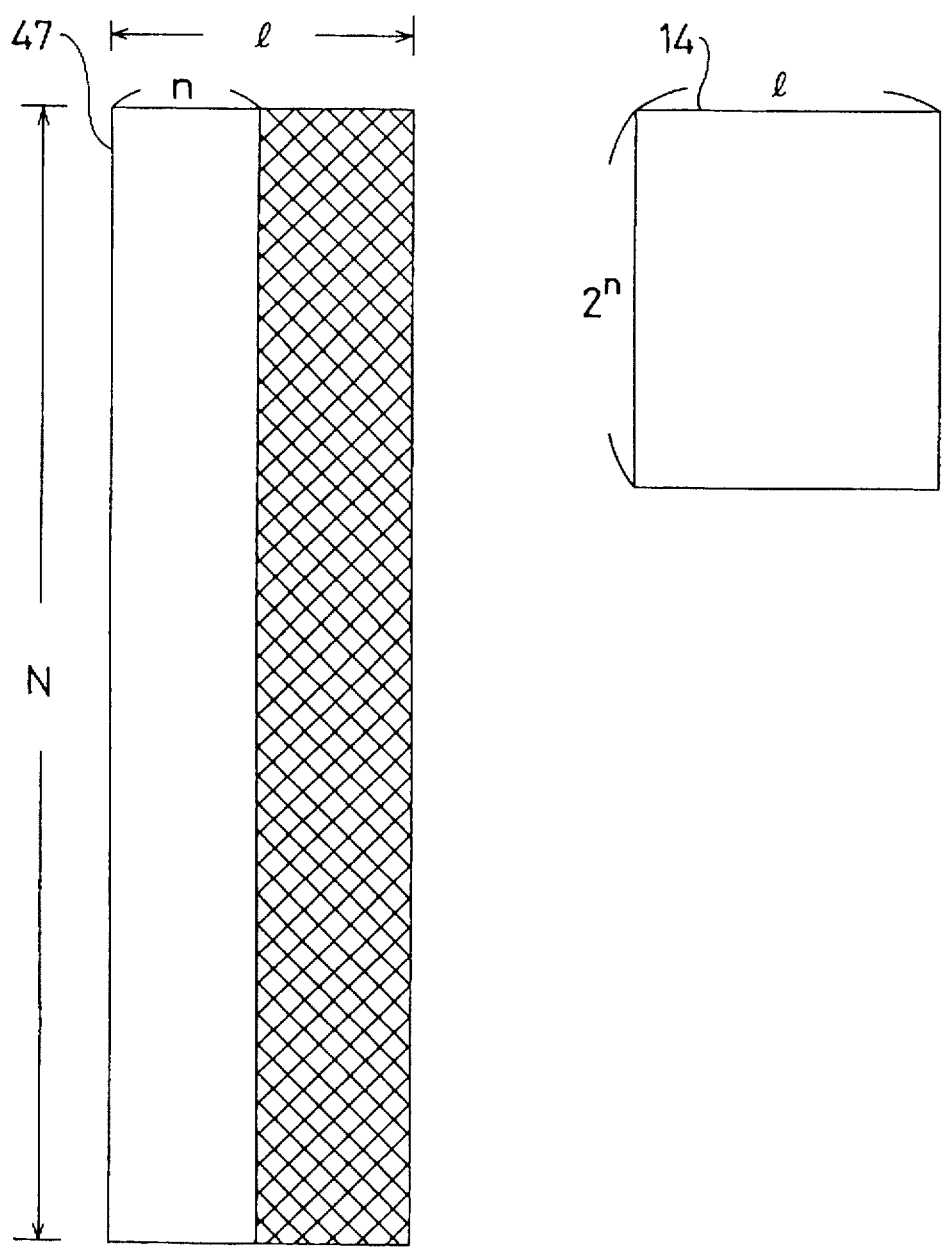
FIG. 23 is a block diagram showing an external memory and a code conversion section.

FIG. 23 is a block diagram showing the external memory 47 and the code conversion section 14. The data of n·1 of the external memory 47 is compressed into the sum of the data of n·N of the external memory 47 and the data of $2_n·1$ of the code conversion section 14. That is, when an equation (1) shown below is established, a compression effect is provided.

$$N \cdot 1 > 2^n \cdot 1 + n \cdot N \quad (1)$$

$$\therefore N > \frac{1}{1-n} \cdot 2^n \quad (2)$$

Accordingly, a compression effect can be provided for an object code having an address length (N) satisfying the equation (2) shown above.

Figure 24:
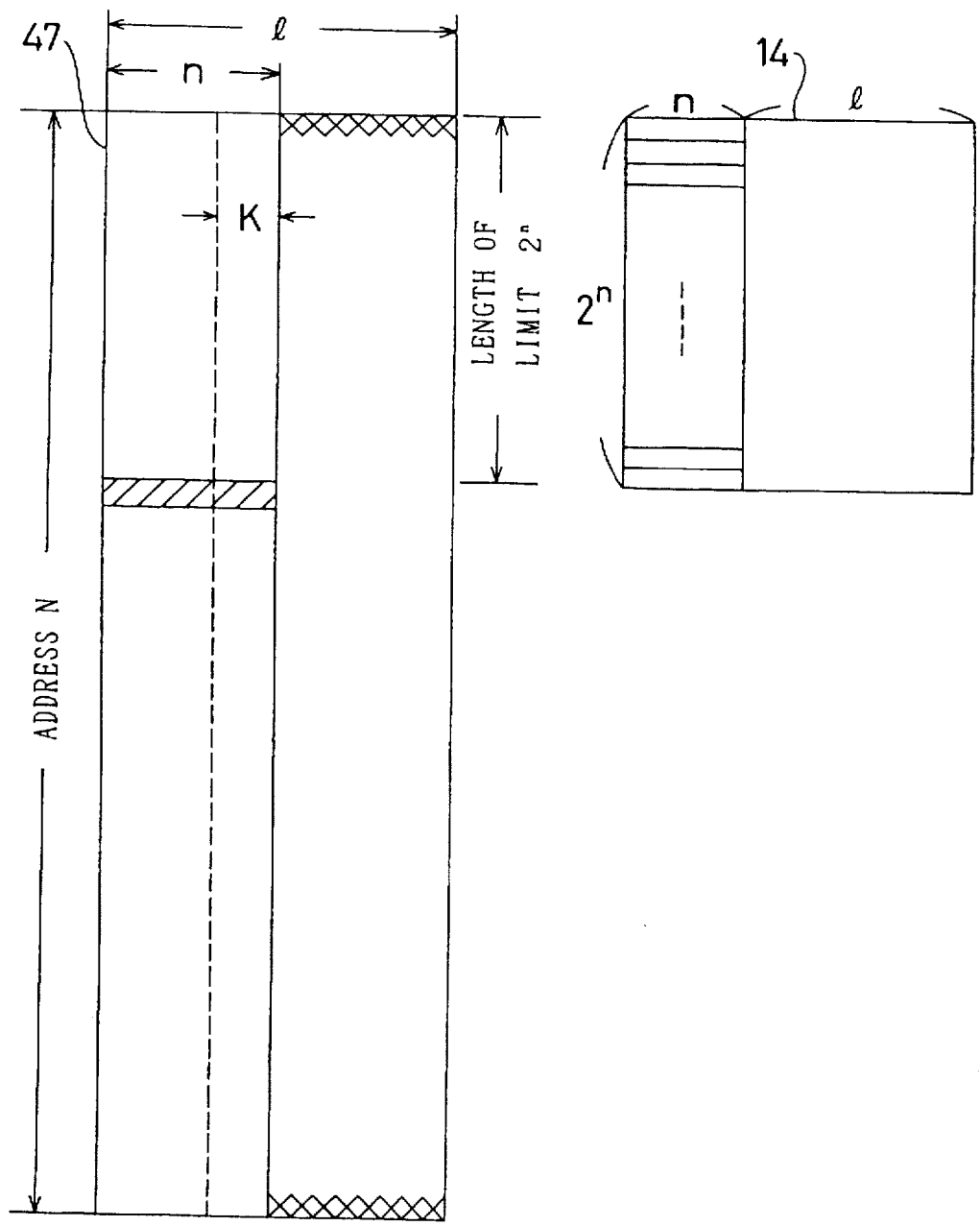
FIG. 24 is a block diagram showing an external memory having a possibility of executing a secondary compression and a code conversion section for a primary compression.

FIG. 24 is a block diagram showing the external memory 47 having a possibility of executing a secondary compression and the code conversion section 14 for a primary compression. As shown in FIG. 23, in the case of the primary compression, the data of N·1 of the external memory 47 is compressed into the sum of the data of n·N of the external memory 47 and the data of $2^n \cdot 1$ of the code conversion section 14. After the primary compression is completed, a secondary compression is executed to compress n-bit data by (k) bits, namely, (n–k) bits. As a result, the data of N·1 of the external memory 47 is compressed into the sum of the data of (n–k)·N of the external memory 47 and the data of $2^n \cdot 1$ of the code conversion section 14. Let it be assumed that an equation (3) shown below is established.

$$N \cdot 1 \geq 2^n \cdot 1 + (n-k) \cdot N \quad (3)$$

$$\therefore N \geq \frac{1}{1-n+k} \cdot 2^n \quad (4)$$

$$(k = 0, 1, 2, 3 \ldots (n-1), n)$$

The compression percentage is n/1. If k=n, there is a possibility of $N=2^n$. This indicates that a memory having an address length (N) of $2^n$ and a bit length of (n) is provided outside the code conversion section 14.

Figure 25:
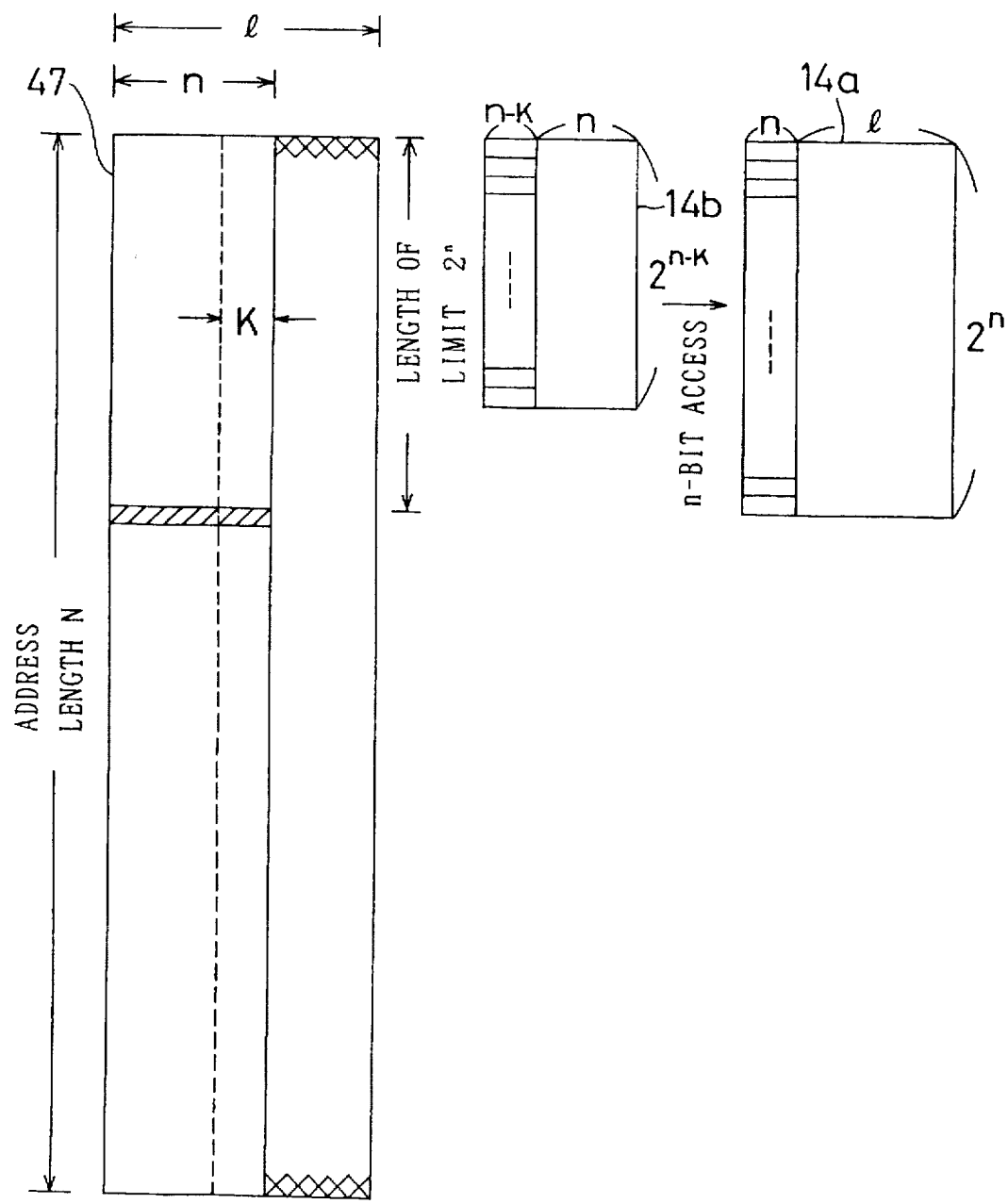
FIG. 25 is a block diagram showing an external memory, a code conversion section for a primary compression, and a code conversion section for a secondary compression provided to execute a secondary compression.

FIG. 25 is a block diagram showing the external memory 47, a code conversion section 14a for a primary compression, and a code conversion section 14b for a secondary compression provided to execute a secondary compression.

An evaluation of approximate equations in a secondary compression will be described below. Supposing that the number of kinds of codes to be compressed is x (maximum value), in the primary compression, the capacity of the external memory can be reduced to a minimum value of a bit length (n) satisfying $x \leq 2^n$ (n: integer n<1). In the code conversion section having (1) bits, when an address length is N, the bit length is (1), and the total capacity N1 of the external memory is the same with respect to the length $2^n$ of the code conversion section, an aggregation of codes which does not require the length $2^n$ is present. This indicates that in the secondary compression, there is a possibility that the bit length (n) of the external memory can be compressed by (k) bits. When the secondary compression of the external memory of (n) bits is executed into a code present in the external memory having (n–k) bits, the number of kinds of codes is (x–α). Thus, an equation (5) shown below is established.

$$x - \alpha \geq 2^{n-k} \quad (5)$$

$$\therefore \alpha \geq x - 2^{n-k} \geq 2^n \cdot (1 - 2^{-k}) \quad (6)$$

That is, it is possible to reduce the length of the code conversion section by α, and there is a possibility that the capacity of the external memory can be reduced by (k·N) bits. This is expressed by an equation (7) shown below:

$$\therefore k \cdot N \geq n \cdot (x - \alpha) \geq n \cdot 2^{n-k} \quad (7)$$

An equation (8) shown below indicates the possibility of a secondary compression:

$$\therefore N \cdot 1 \geq 1 \cdot 2^n + n \cdot N \geq 1 \cdot 2^n + n \cdot 2^{n-k} + (n-k) \cdot \quad (8)$$

$$N \geq 1 \cdot 2^n + (n-k) \cdot N$$

An equation (9) shown below is established from $N \cdot 1 \geq 1^{19} \cdot 2n + n \cdot N$ $$N \geq \frac{1}{1-n} \cdot 2^n \quad (9)$$

An equation (10) shown below is established from $N \cdot 1 \geq 1 \cdot 2^n + n \cdot 2^{n-k} + (n-k) \cdot N$.

$$N \geq \frac{2^n}{1-n+k} \cdot (1 + n \cdot 2^{-k}) \quad (10)$$

An equation (11) shown below is established from $N \cdot 1 \geq 1 \cdot 2^n + (n-k) \cdot N$.

$$N \geq \frac{1}{1-n+k} \cdot 2^n \quad (11)$$

An equation (12) shown below is established when k=0 in the equation (10).

$$N \geq \frac{1+n}{1-n} \cdot 2^n \quad (12)$$

An equation (13) shown below is established when k=n in the equation (10).

$$N \geq 2^n + \frac{n}{1} \quad (13)$$

An equation (14) shown below is established when k=0 in the equation (11).

$$N \geq \frac{1}{1-n} \cdot 2^n \quad (14)$$

An equation (15) shown below is established when k=n in the equation (11).

$$N \geq 2^n \quad (15)$$

Figure 26:
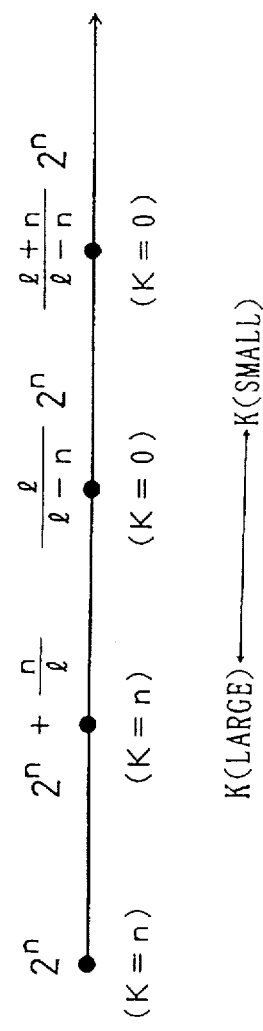
FIG. 26 is a view showing a lower limit or a limitation of an address length to which a secondary compression can be applied.

The equations (9), (10), and (11) indicate that there is a possibility that a secondary compression is executed further by (k) bits from a compression percentage n/1. In the secondary compression, the address length (N) has a lower limit or a limitation which are the ones shown by the equations (9), (10), and (1 1). As shown in FIG. 26, when (k) bits can be made to be great, the lower limit or the limitation of the address length (N) becomes small, whereas when (k) bits is small, the lower limit or the limitation of the address length (N) becomes great.

An equation (16) shown below indicates that a possibility of further reducing the capacity of the external memory by kN bits:

$$N \geq \frac{2^n}{1-n+k} \cdot (1 + n \cdot 2^{-k}) \quad (16)$$

$$(k = 0, 1, 2, 3 \ldots (n-1), n)$$

The compression percentage is (n–k)/1.

In the primary compression, k=0. Accordingly, the address length (N) satisfying an equation (17) shown below is the lower limit. At this time, the compression percentage is n/1.

$$\therefore N > \frac{1+n}{1-n} \cdot 2^n \qquad (17)$$

Figure 27:
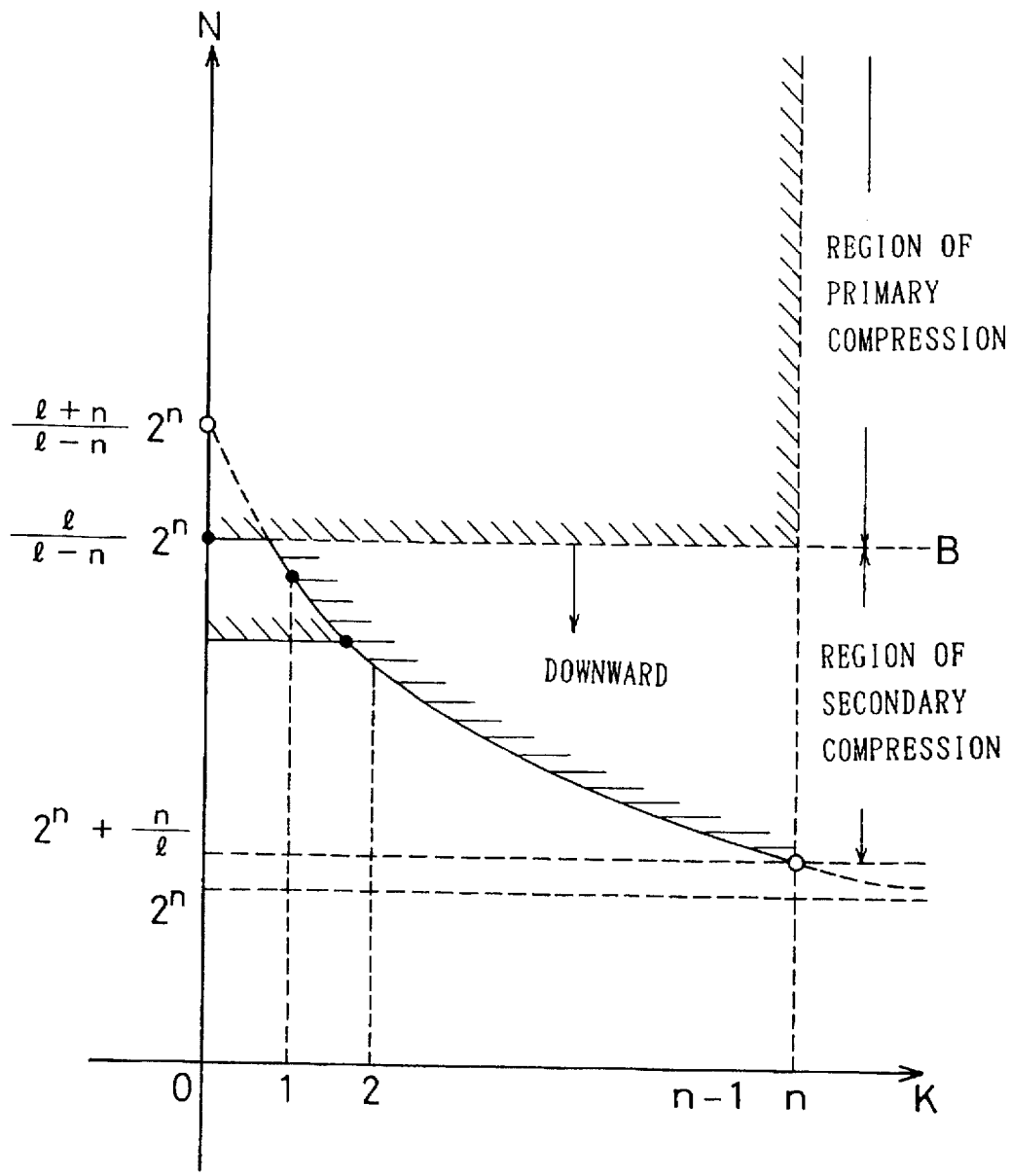
FIG. 27 is a graph showing the relationship between an address length obtained by executing a secondary compression of (k) bits and a bit length (k) in the secondary compression with respect to a primary compression.

FIG. 27 is a graph showing the relationship between the address length (N) obtained by executing a secondary compression of (k) bits after the primary compression is executed and a bit length (k) in the secondary compression. As shown in FIG. 27, there is a possibility that the secondary compression can be executed after the primary compression is performed. FIG. 27 indicates that in calculation, the capacity of the external memory can be reduced to the capacity of the one having the limitation address length $N=2^n$ by repeatedly executing third, fourth, fifth, . . . , (i)th, . . . compressions and high-order compressions. In FIG. 27, the boundary between the primary compression and the secondary compression changes downward, when the bit length (1) of a microprocessor is great.

Table 1 shows the result obtained by analyzing the graph of FIG. 27.

In Table 1, equations (18) and (19) shown below are used.

$$f(k) = \frac{2^n}{1-n+k} \cdot (1+n \cdot 2^{-k}) \qquad (18)$$

$$(k = 1, 2, 3 \ldots -(n-1))$$

$$f(0) = \frac{1}{1-n} \cdot 2^n \qquad (19)$$

As shown in Table 1, as the bit length (1) of a microprocessor becomes greater, the compression region of the primary compression becomes greater and thus a greater compression effect can be obtained. Practically, a sufficient compression percentage is obtained in the primary compression and the capacity of the external memory can be compressed. As is apparent from Table 1, in a 1-bit microprocessor, the capacity of the external memory can be reduced by (k) bits by executing the secondary compression. For example, k=2 in the 32-bit microprocessor (bit length (1)=32). Thus, the capacity of the external memory can be further compressed by 2 bits and hence, compressed into (n−2). In an experiment using a 32-bit microprocessor, n=16. Thus, there is a high possibility that the bit length of the external memory can be compressed into 14 bits by executing the secondary compression.

Table 2 shows the lower limit of the address length (N) which can be compressed by the primary compression executed for the 32-bit microprocessor.

Because Table 2 indicates the primary compression executed for the 32-bit microprocessor, an equation (20) shown below is established:

$$2^{32} \geq N > \frac{32}{32-n} \cdot 2^n \qquad (20)$$

$$(1 \leq n \leq 28)$$

Although not shown in Table 2, an equation (21) shown below is established in the primary compression executed for a 64-bit microprocessor (1=64):

$$2^{64} \geq N > \frac{64}{64-n} \cdot 2^n \qquad (21)$$

$$(1 \leq n \leq 60)$$

Table 3 shows the lower limit of the address length (N) which can be compressed by the secondary compression executed for the 32-bit microprocessor.

Because Table 3 shows the secondary compression executed for the 32-bit microprocessor, an equation (22) shown below is established:

$$2^{32} \geq N > \frac{2^n}{32-n+2} \cdot (32+n \cdot 2^{-2}) \qquad (22)$$

$$(1 \leq n \leq 29)$$

Although not shown in Table 3, an equation (23) shown below is established by the secondary compression executed for the 64-bit microprocessor (1=64, k=2):

$$2^{64} \geq N > \frac{2^n}{64-n+2} \cdot (64+n \cdot 2^{-2}) \qquad (23)$$

$$(1 \leq n \leq 60)$$

Figure 28:
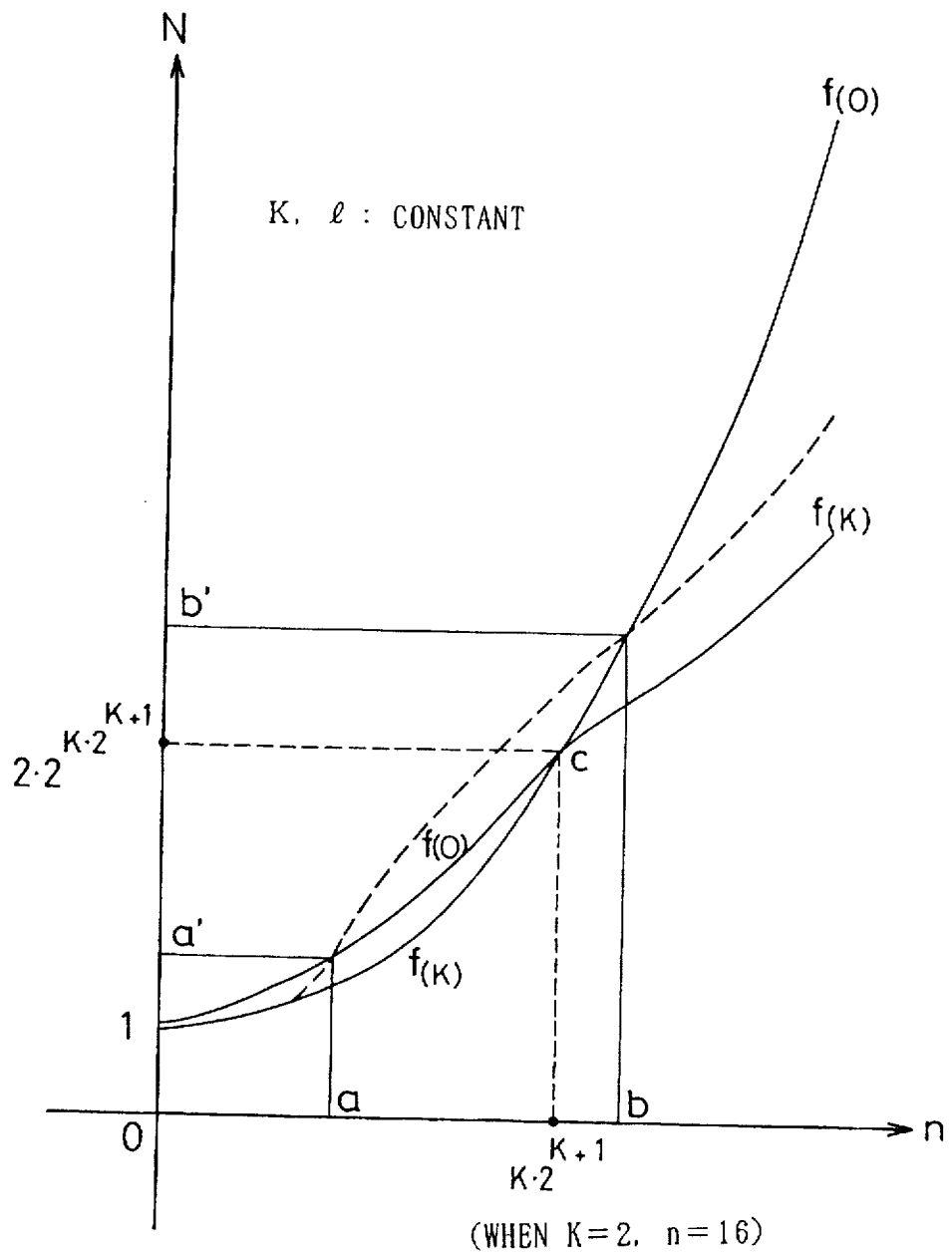
FIG. 28 is a graph showing the relationship between an address length (N) and (n) when I and k are constant.

FIG. 28 is a graph showing the relationship between the address length (N) and (n) when 1 and k are constant. In FIG. 28, solid lines indicate the case of $f(0) \geq f(k)$, whereas dotted lines indicate $f(0) \leq f(k)$. The equation $f(0) \leq f(k)$ is established, depending on the bit length of the microprocessor. In the case of the 32-bit microprocessor, when k=2, 1=32 and n=16.

Table 4 shows an example in which points (a) and (b), or a point of contact (c) in the graph of FIG. 28 are shown by numerical values.

The microprocessor having bit lengths shown in Table 4 has the following:

(1) When 1=16, n=8 is a midpoint of $3 \leq n \leq 13$
(2) When 1=32, n=16 is a midpoint of $3 \leq n \leq 29$
(3) When 1=48, n=24 is a midpoint of $11 \leq n \leq 37$
(4) When 1=64, n=32 is a midpoint of $10 \leq n \leq 54$
(5) When 1=96, n=48 is a midpoint of $9 \leq n \leq 87$
(6) When 1=128, n=64 is a midpoint of $33 \leq n \leq 95$
(7) When 1=256, n=128 is a midpoint of $27 \leq n \leq 229$
(8) When 1=512, n=256 is a midpoint of $75 \leq n \leq 437$
(9) When 1=640, n=320 is a midpoint of $73 \leq n \leq 567$ FIG. 29 is a view showing an example of a memory image obtained by reducing the capacity of the external memory to a bit length (n) in the primary compression and then executing the secondary compression. Generally, programs or data are plural. As shown in FIG. 29, the memory has address regions $N_2$ and $N_4$ to which the secondary compression of (k) bits can be applied. Further, some memories have address regions to which compressions higher than second order can be applied. But practically, the design is made based on the memory of a bit length (n).

It will be apparent from the foregoing that, while the invention has been described in detail and illustrated, these are only particular illustrations and examples and the invention is not limited to these, the spirit and scope of the invention is limited only by the appended claims.

TABLE

| $1 \leq 8$ | $8 < 1 \leq 32$ | $32 < 1 \leq 96$ | $96 < 1 \leq 256$ | $256 < 1 \leq 640$ | ... |
|---|---|---|---|---|---|
| $f(1) \leq f(0)$ | $f(2) \leq f(0) < f(1)$ | $f(3) \leq f(0) < f(2)$ | $f(4) \leq f(0) < f(3)$ | $f(5) \leq f(0) < f(4)$ | ... |
| $k \leq 1$ | $1 \leq k \leq 2$ | $2 \leq k \leq 3$ | $3 \leq k \leq 4$ | $4 \leq k \leq 5$ | ... |

TABLE 2 l = 32, N: WORD

| n | N> | n | N> |
|---|---|---|---|
| 0 | (1) | 16 | 131072 |
| 1 | 3 | 17 | 279621 |
| 2 | 5 | 18 | 599187 |
| 3 | 9 | 19 | 1920556 |
| 4 | 19 | 20 | 2796203 |
| 5 | 38 | 21 | 6100806 |
| 6 | 79 | 22 | 13421773 |
| 7 | 164 | 23 | 29826162 |
| 8 | 342 | 24 | 67108864 |
| 9 | 713 | 25 | 153391690 |
| 10 | 1490 | 26 | 357913942 |
| 11 | 3121 | 27 | 858993460 |
| 12 | 6554 | 28 | 2147483648 |
| 13 | 13798 | 29 | — |
| 14 | 29128 | 30 | — |
| 15 | 61681 | 31 | — |

TABLE 3 l = 32, k = 2, N: WORD

| n | N> | n | N> |
|---|---|---|---|
| 0 | (1) | (16) | 131072 |
| 1 | 2 | 17 | 279492 |
| 2 | 5 | 18 | 598016 |
| 3 | 9 | 19 | 1284506 |
| 4 | 18 | 20 | 2771237 |
| 5 | 37 | 21 | 6009148 |
| 6 | 77 | 22 | 13107200 |
| 7 | 160 | 23 | 28788178 |
| 8 | 335 | 24 | 63753421 |
| 9 | 702 | 25 | 142606336 |
| 10 | 1472 | 26 | 322961408 |
| 11 | 3095 | 27 | 742990995 |
| 12 | 6517 | 28 | 1744830464 |
| 13 | 13751 | 29 | 4214436660 |
| 14 | 29082 | 30 | — |
| 15 | 61656 | 31 | — |

TABLE 4

(l > n)

| l | a < n < b | | k | l | a < n < b | | k |
|---|---|---|---|---|---|---|---|
| 4 | 1 | 3 | 0 | 64 | 10 | 54 | 2 |
| 7 | 1 | 6 | 0 | 65 | 10 | 55 | 2 |
| 8 | n = 4 | | 1 | 95 | 9 | 86 | 2 |
| 9 | 3 | 6 | 1 | 96 | 9 | 87 | 2 |
| 15 | 3 | 12 | 1 | | n = 48 | | 3 |
| 16 | 3 | 13 | 1 | 97 | 44 | 53 | 3 |
| 17 | 3 | 14 | 1 | 128 | 33 | 95 | 3 |
| 31 | 3 | 28 | 1 | 256 | 27 | 229 | 3 |
| 32 | 3 | 29 | 1 | | n = 128 | | 4 |
| | n = 16 | | 2 | 512 | 75 | 437 | 4 |
| 33 | 14 | 19 | 2 | 640 | 73 | 567 | 4 |
| 48 | 11 | 37 | 2 | | n = 320 | | 5 |
| 63 | 10 | 53 | 2 | ... | ... | | ... |

What is claimed is:

1. A digital data processing apparatus comprising:

a memory;

a code conversion section for assigning a virtual code for a duplicate code and converting said virtual code into a real code, said code conversion section having an address portion and an instruction portion, wherein said memory issues an address to said code conversion section through a data transmission path;

a central processing unit for receiving an instruction from said instruction portion of said code conversion section;

a code inverse conversion section, having an instruction portion and an address portion, wherein said central processing unit accesses said instruction portion of said code inverse conversion section, and wherein said code inverse conversion section converts said instruction to an address which is outputted to said memory through said data transmission path.

2. A digital data processing apparatus according to claim 1, wherein said central processing unit includes said code conversion section.

3. A digital data processing apparatus according to claim 1, wherein said memory consists of an external memory, and said external memory includes said code conversion section.

4. A digital data processing apparatus according to claim 2, wherein said code conversion section consists of a reloadable read only memory.

5. A digital data processing apparatus according to claim 3, wherein said code conversion section consists of a reloadable read only memory.

6. A digital data processing apparatus according to claim 2, wherein the code conversion section consists of a random access memory.

7. A digital data processing apparatus according to claim 3, wherein the code conversion section consists of a random access memory.

8. A digital data processing apparatus according to claim 2, wherein said central processing unit consists of a microprocessor.

9. A digital data processing apparatus according to claim 3, wherein said external memory consists of a semiconductor memory.

10. A digital data processing apparatus according to claim 1, wherein a plurality of programs is stored in said memory, and said memory includes a program to which a primary compression and high-order compressions are applied by said code conversion section.

11. A digital data processing apparatus according to claim 1, wherein a plurality of data is stored in said memory, and said memory includes data to which a primary compression and high-order compressions are applied by said code conversion section.

12. A digital data processing apparatus comprising a memory and a central processing unit, wherein a code conversion section for assigning a virtual code for a duplicate code and converting the virtual code into a real code is provided, and wherein a plurality of programs is stored in said memory, and said memory includes a program to which a primary compression and high-order compressions are applied by said code conversion section.

13. A digital data processing apparatus comprising a memory and a central processing unit, wherein a code conversion section for assigning a virtual code for a duplicate code and converting the virtual code into a real code is provided, and wherein a plurality of data is stored in said memory, and said memory includes data to which a primary compression and high-order compressions are applied by said code conversion section.

14. A digital data processing apparatus according to claim 1, wherein said code conversion section assigns a virtual code for a duplicate code which is included in data and converts said virtual code to a real code.

15. A digital data processing apparatus according to claim 1, wherein said code conversion section assigns a virtual code for a duplicate code which is included in a program and converts said virtual code to a real code.

* * * * *

UNITED STATES PATENT AND TRADEMARK OFFICE
CERTIFICATE OF CORRECTION

PATENT NO. : 5,799,138

DATED : August 25, 1998

INVENTOR(S) : Yoshida

It is certified that error appears in the above-identified patent and that said Letters Patent is hereby corrected as shown below:

```
On the title page, and col. 1, lines 1 & 2,
Item [54], line 1, delete "INSTRUCTION-WORD-LINK" insert therefor -- INSTRUCTION-WORD-LENGTH --
```

Signed and Sealed this

First Day of December, 1998

Attest:

BRUCE LEHMAN

*Attesting Officer*  *Commissioner of Patents and Trademarks*